United States Patent
Matsuoka

(10) Patent No.: US 9,368,170 B2
(45) Date of Patent: Jun. 14, 2016

(54) MEMORY DEVICE WITH RESISTANCE-CHANGE TYPE STORAGE ELEMENTS

(71) Applicant: KABUSHIKI KAISHA TOSHIBA, Minato-ku, Tokyo (JP)

(72) Inventor: Fumiyoshi Matsuoka, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/482,993

(22) Filed: Sep. 10, 2014

(65) Prior Publication Data

US 2015/0262623 A1 Sep. 17, 2015

Related U.S. Application Data

(60) Provisional application No. 61/953,512, filed on Mar. 14, 2014.

(51) Int. Cl.
| | |
|---|---|
| *G11C 7/22* | (2006.01) |
| *G11C 7/12* | (2006.01) |
| *G11C 11/16* | (2006.01) |
| *G11C 13/00* | (2006.01) |

(52) U.S. Cl.
CPC *G11C 7/12* (2013.01); *G11C 11/16* (2013.01); *G11C 11/1655* (2013.01); *G11C 11/1675* (2013.01); *G11C 13/0026* (2013.01); *G11C 13/0069* (2013.01); *G11C 2213/79* (2013.01)

(58) Field of Classification Search
CPC ........ G11C 11/165; G11C 5/06; G11C 11/16; G11C 11/15; G11C 13/0069; G11C 2213/79; G11C 7/22

USPC ............................................. 365/148, 145, 72
See application file for complete search history.

(56) References Cited

U.S. PATENT DOCUMENTS

| | | | | |
|---|---|---|---|---|
| 6,297,985 B1 * | 10/2001 | Kang | ..................... | G11C 11/22 365/145 |
| 7,113,419 B2 * | 9/2006 | Chow | ..................... | G11C 11/22 365/145 |
| 7,542,326 B2 * | 6/2009 | Yoshimura | ............. | G11C 11/22 365/148 |
| 8,508,978 B2 | 8/2013 | Ishihara et al. | | |
| 9,001,607 B2 * | 4/2015 | Ong | ....................... | G11C 7/222 365/219 |
| 2005/0162891 A1 * | 7/2005 | Chow | ..................... | G11C 11/22 365/145 |
| 2008/0049487 A1 * | 2/2008 | Yoshimura | ............. | G11C 11/22 365/148 |
| 2013/0242638 A1 | 9/2013 | Takashima | | |
| 2014/0032812 A1 * | 1/2014 | Ong | ....................... | G11C 7/222 711/102 |

* cited by examiner

*Primary Examiner* — Richard Elms
*Assistant Examiner* — Xiaochun L Chen
(74) *Attorney, Agent, or Firm* — Holtz, Holtz & Volek PC

(57) ABSTRACT

According to one embodiment, a memory device includes memory cells including storage elements, each storing information based on a change of resistance, word lines, first bit lines, second bit lines, column selection transistors connected to the first bit lines, and precharge transistors connected to the first bit lines. At least two of the precharge transistors are selected by a common control signal and apply a precharge voltage to at least two of the corresponding first bit lines before writing information to a selected memory cell, and the precharge voltage is the same as a voltage to be applied to at least two of the second bit lines paired with the at least two of the first bit lines.

22 Claims, 23 Drawing Sheets

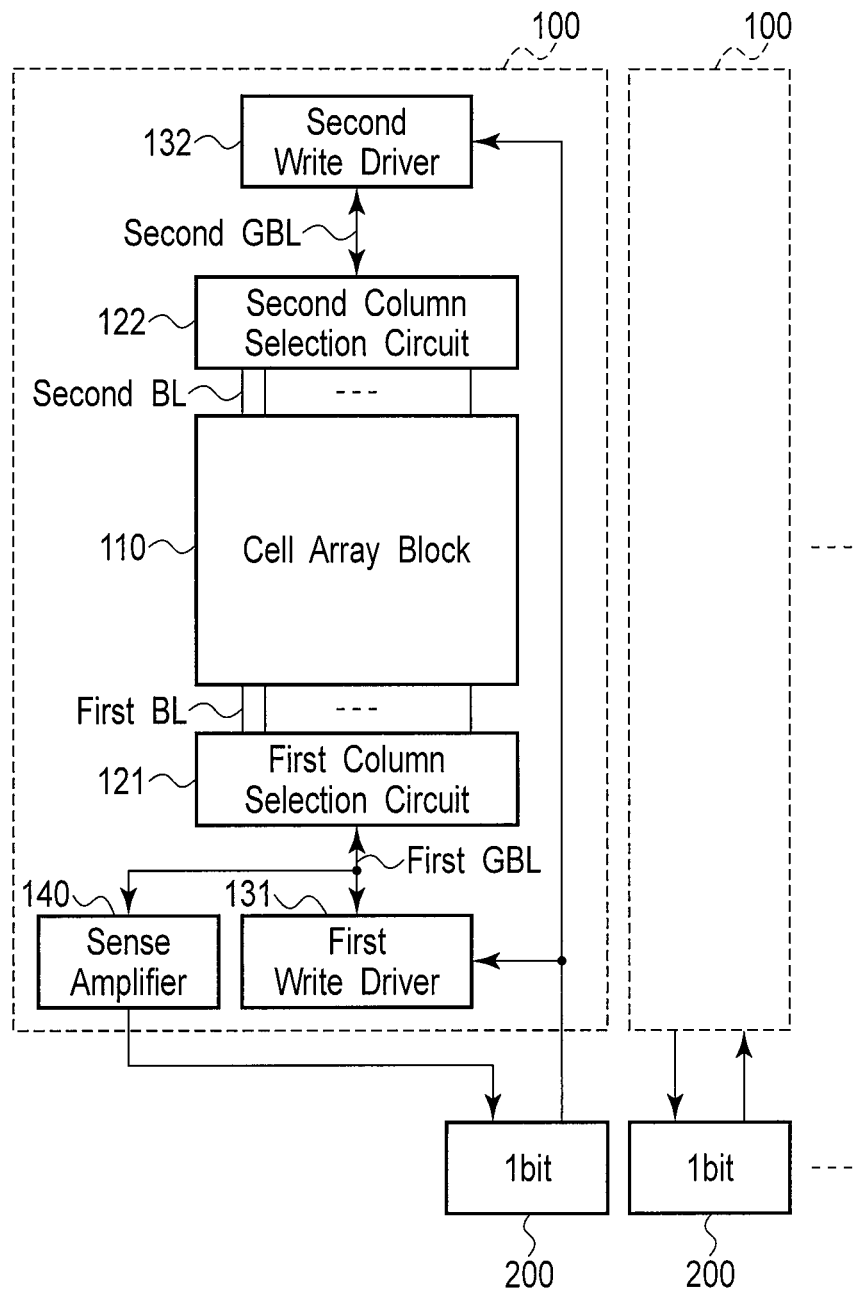
F I G. 1

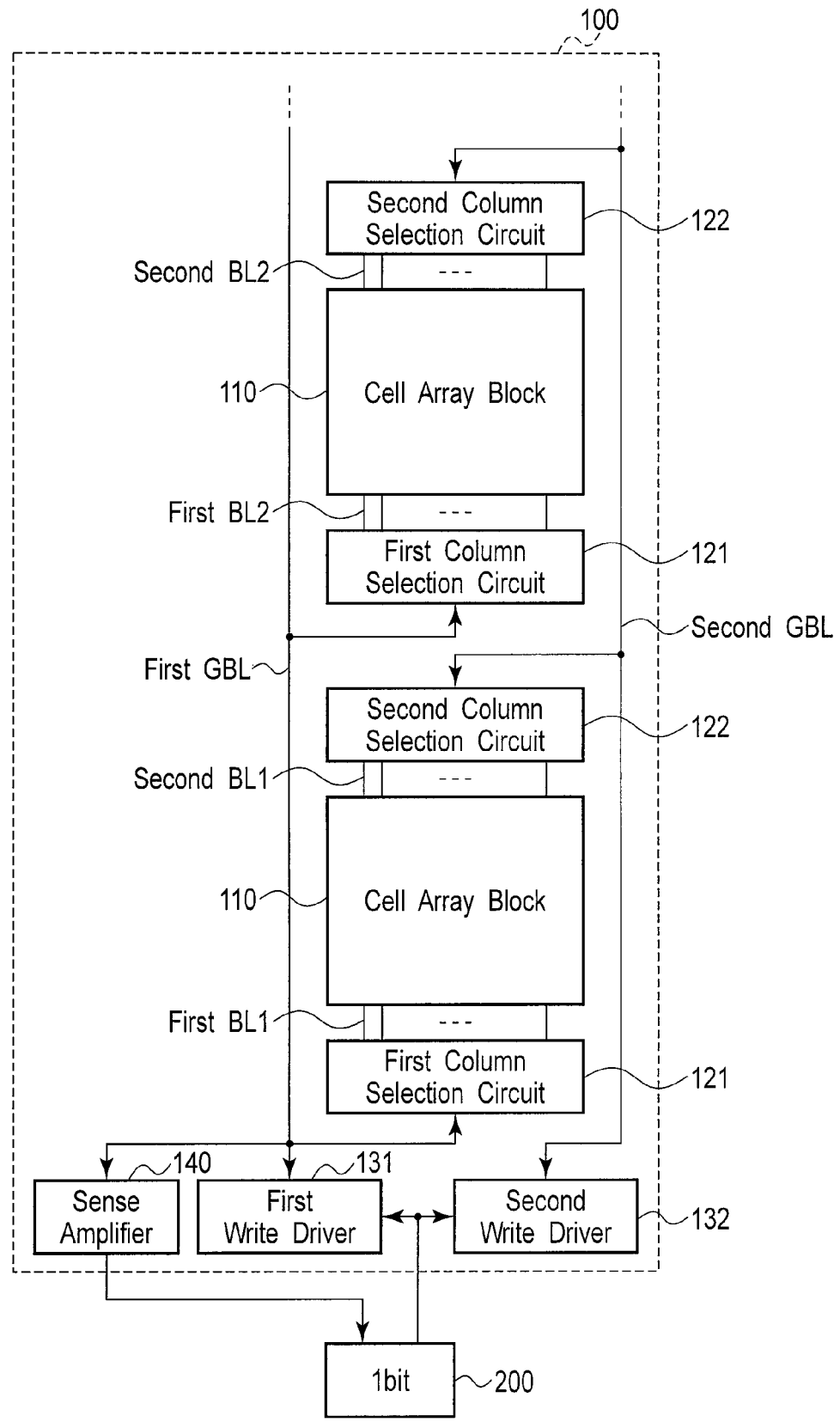
F I G. 2

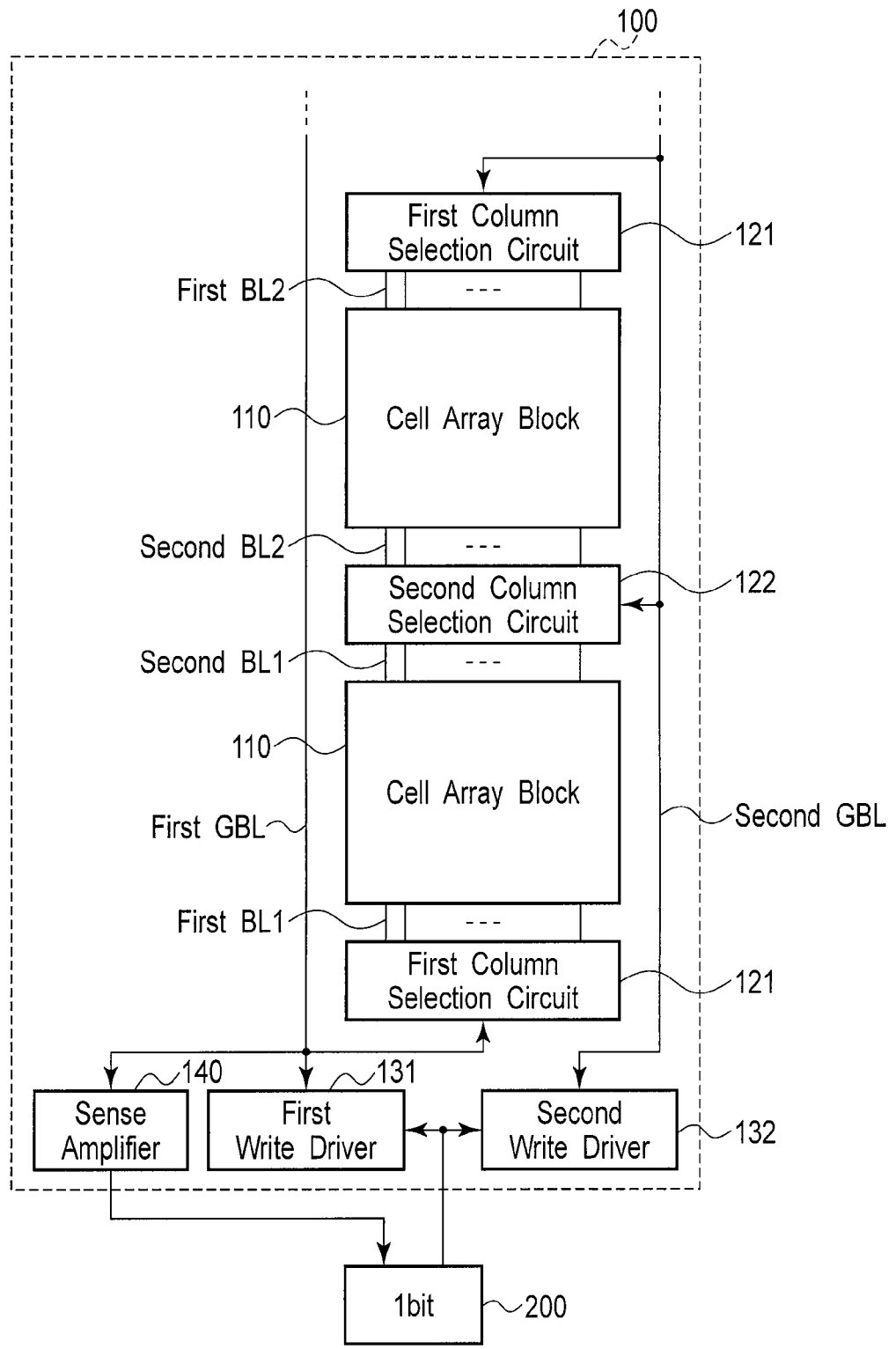
F I G. 3

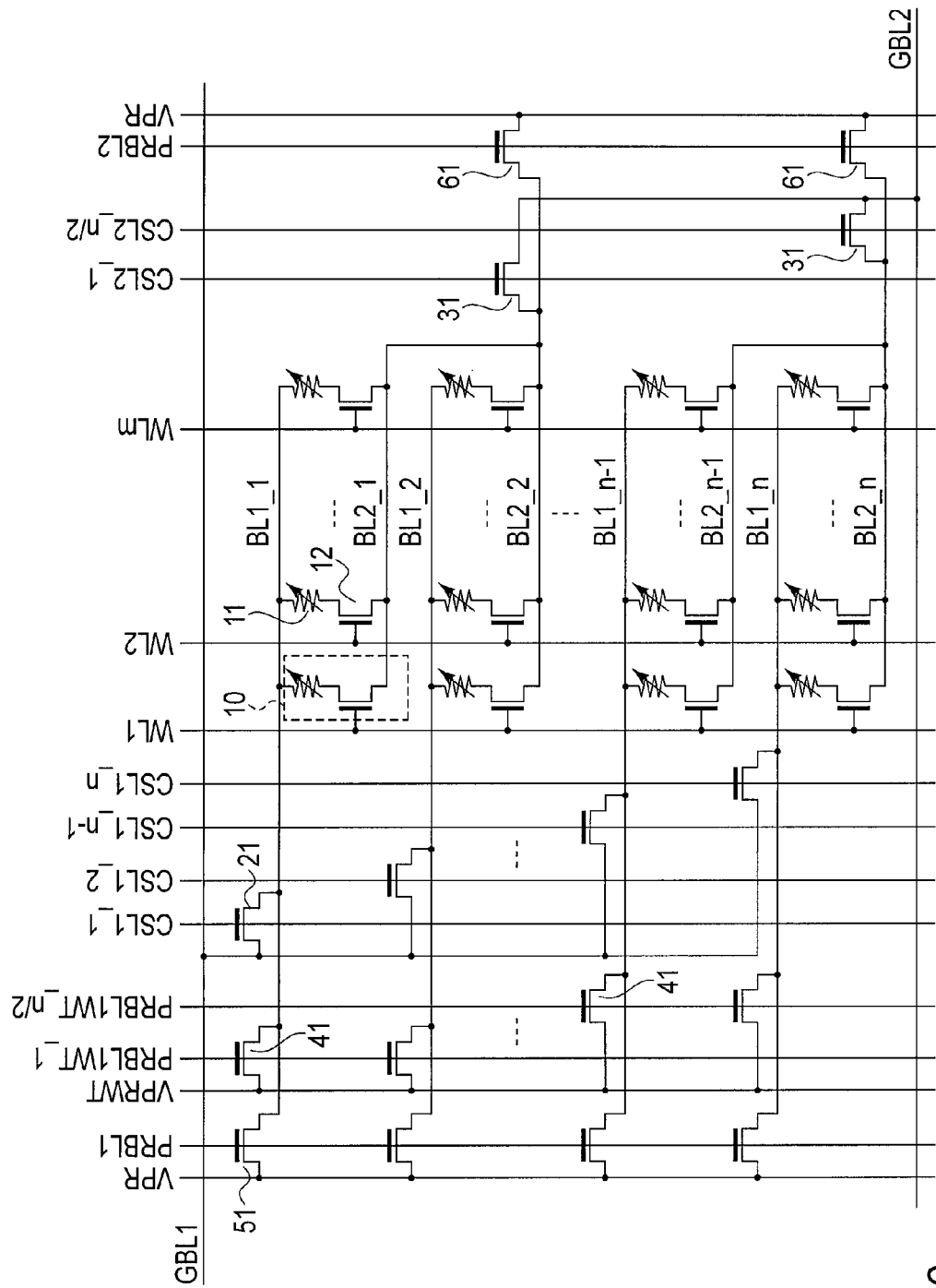
F I G. 6

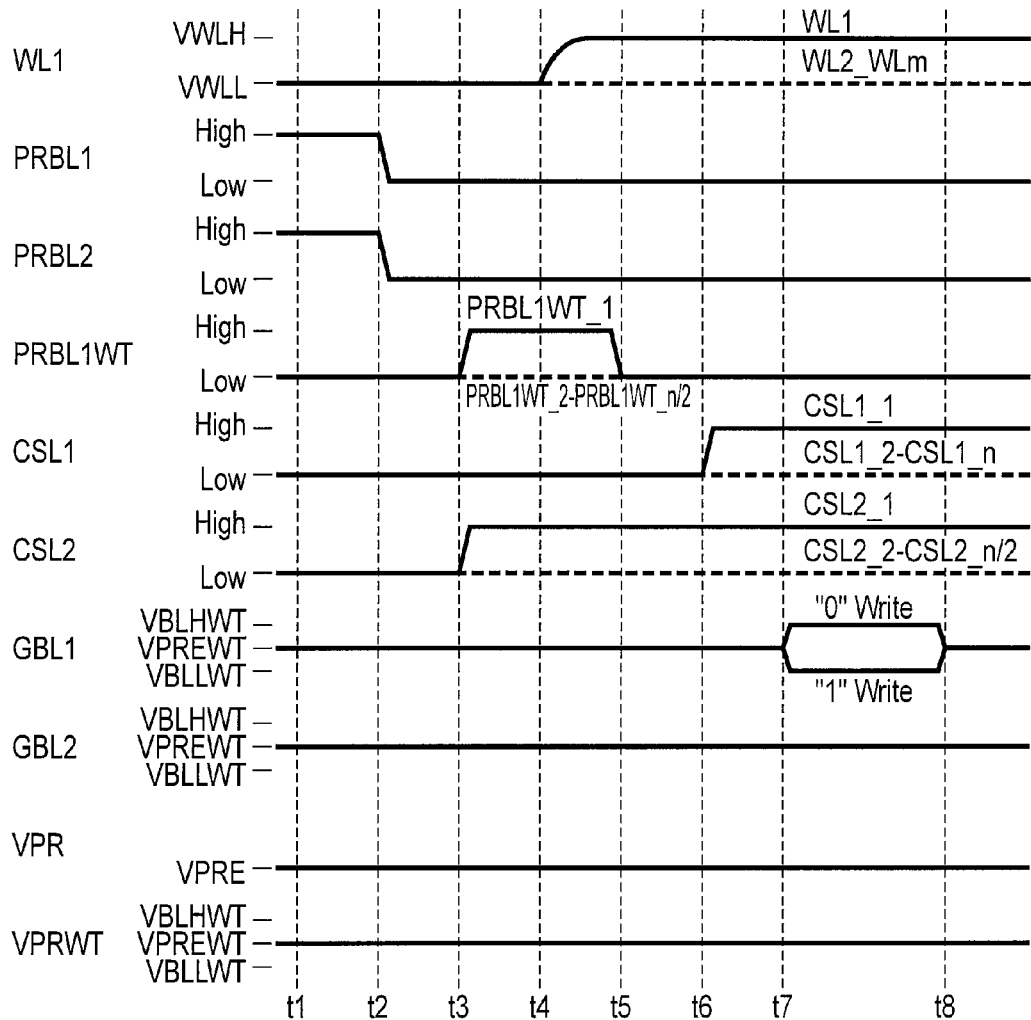
F I G. 7

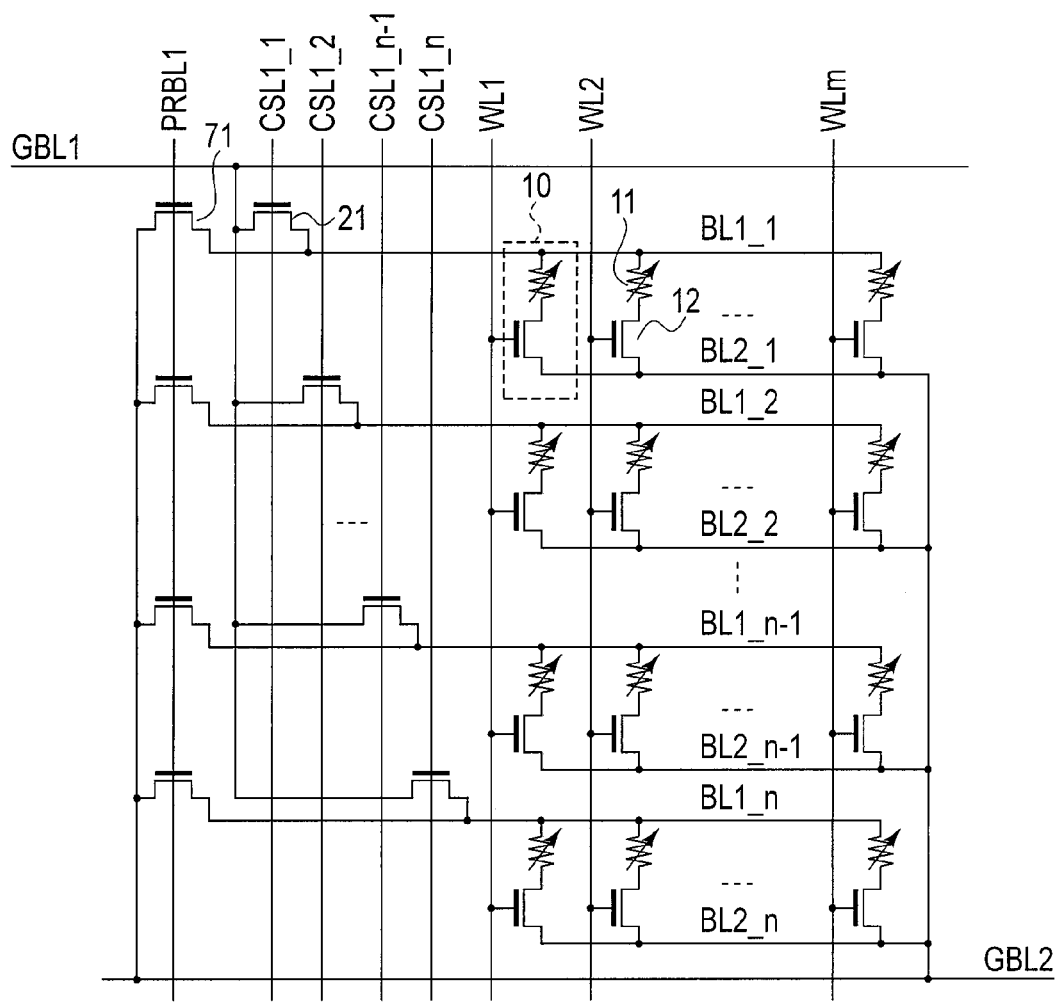
F I G. 10

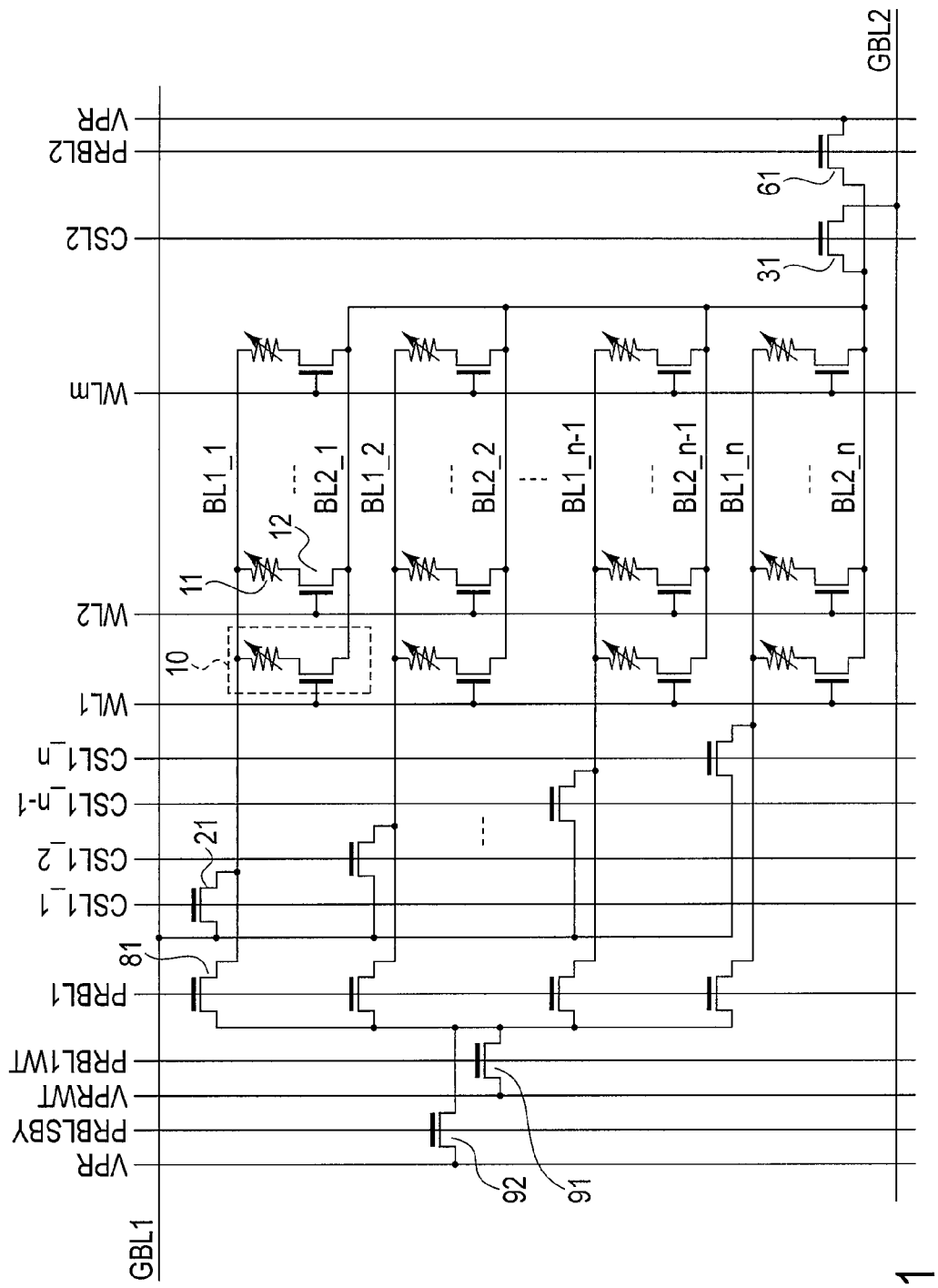
F I G. 11

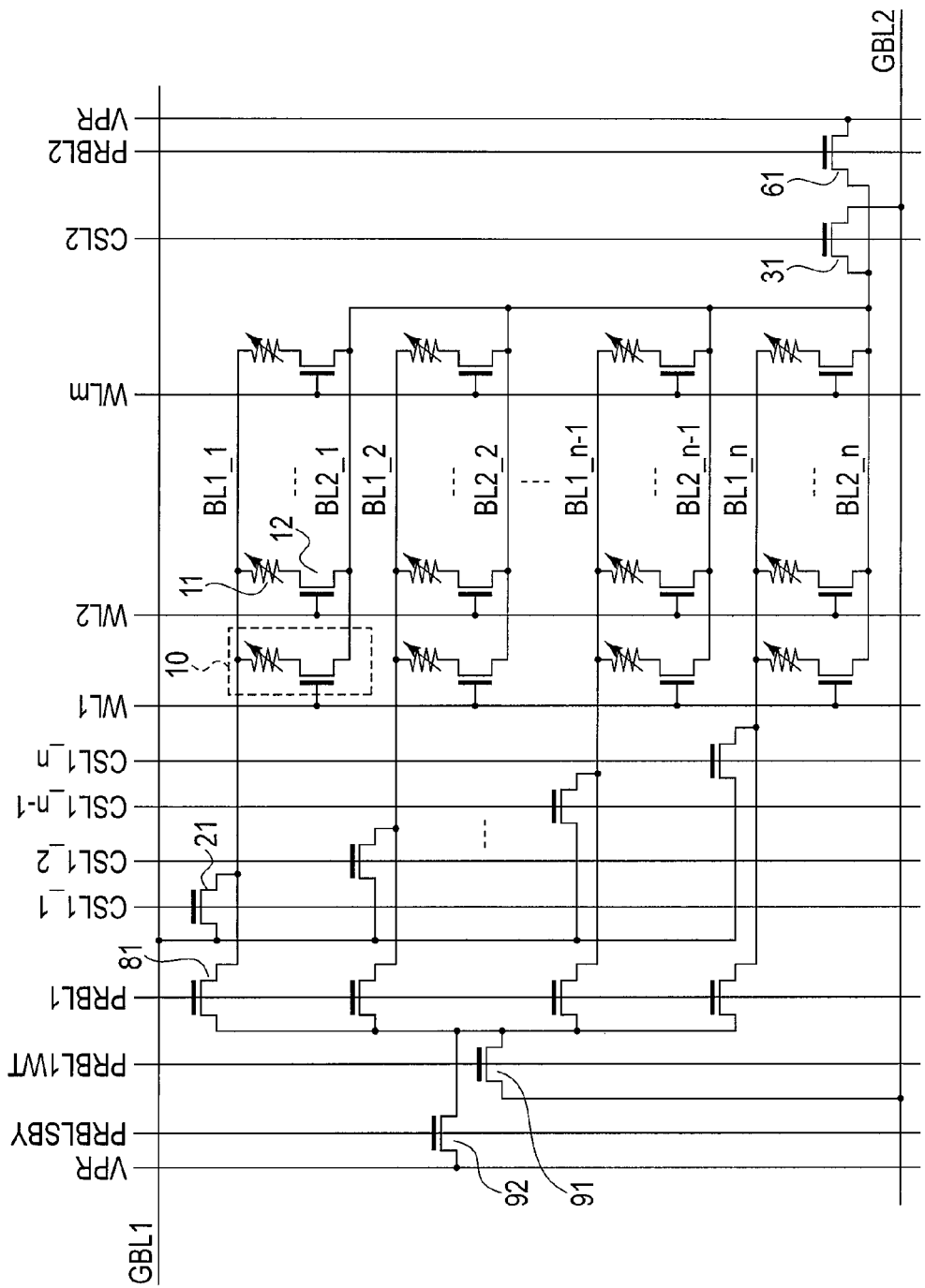
F I G. 13

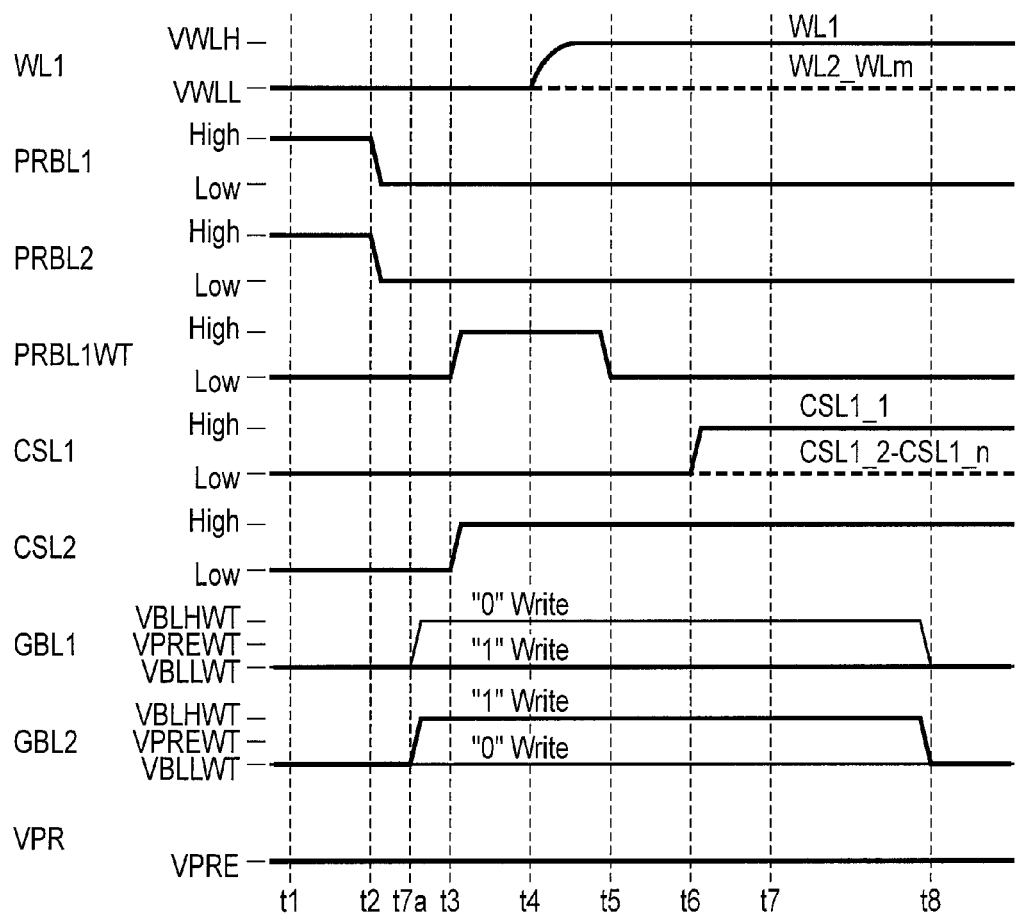
F I G. 16

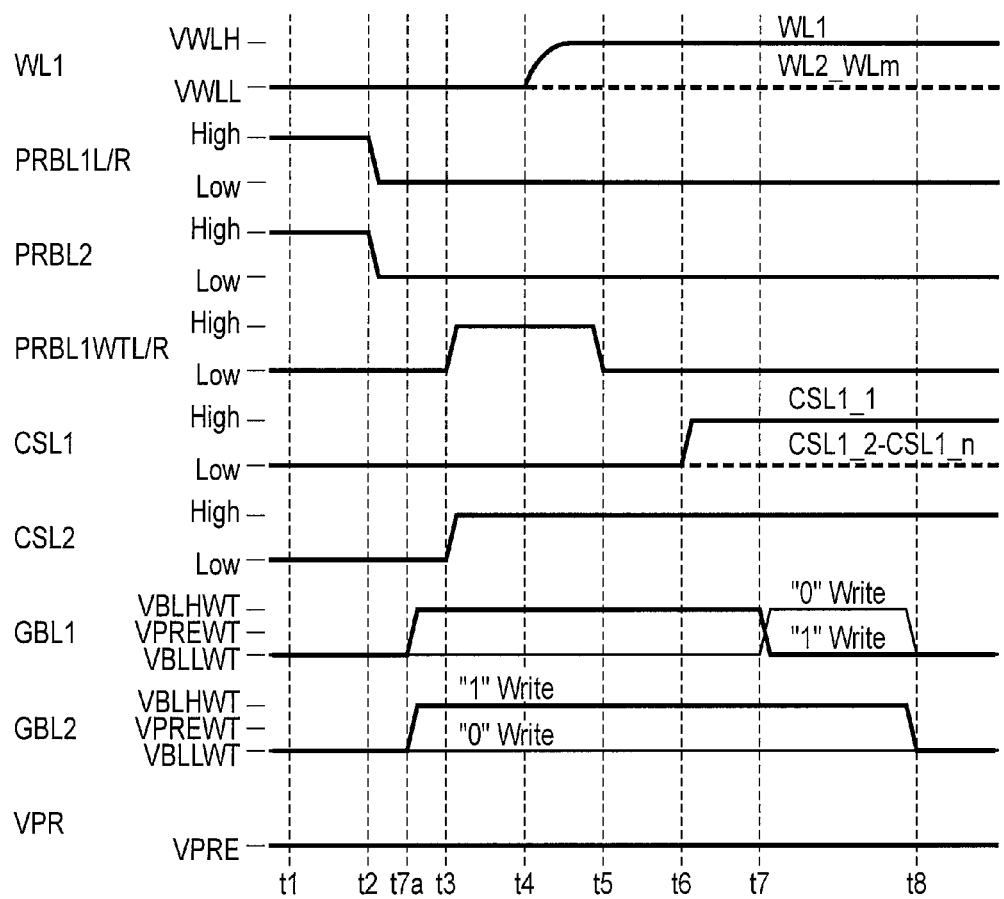
F I G. 20

MEMORY DEVICE WITH RESISTANCE-CHANGE TYPE STORAGE ELEMENTS

CROSS-REFERENCE TO RELATED APPLICATIONS

This application claims the benefit of U.S. Provisional Application No. 61/953,512, filed Mar. 14, 2014, the entire contents of which are incorporated herein by reference.

FIELD

Embodiments described herein relate generally to a memory device.

BACKGROUND

Memory devices in which a resistance-change type storage element is formed on a semiconductor substrate are suggested. A binary value (0 or 1) is stored in the resistance-change type storage element based on a change of resistance. Magnetic random access memories using a magnetoresistive effect element are a typical memory device using the resistance-change type storage element.

BRIEF DESCRIPTION OF THE DRAWINGS

FIG. 1 is a block diagram showing a first general configuration example of a memory device according to an embodiment.

FIG. 2 is a block diagram showing a second general configuration example of the memory device according to the embodiment.

FIG. 3 is a block diagram showing a third general configuration example of the memory device according to the embodiment.

FIG. 6 is an electric circuit diagram showing a configuration of a memory device according to a first modified embodiment in the first embodiment.

FIG. 7 is a timing chart showing operations of the first modified embodiment in the first embodiment.

FIG. 10 is an electric circuit diagram showing a configuration of a memory device according to a third modified embodiment in the first embodiment.

FIG. 11 is an electric circuit diagram showing a configuration according to a memory device according to a fourth modified embodiment in the first embodiment.

FIG. 13 is an electric circuit diagram showing a configuration of a memory device according to a fifth modified embodiment in the first embodiment.

FIG. 16 is a timing chart showing operations of a modified embodiment in the second embodiment.

FIG. 20 is a timing chart showing operations of the first modified embodiment in the third embodiment.

DETAILED DESCRIPTION

Figure 4:
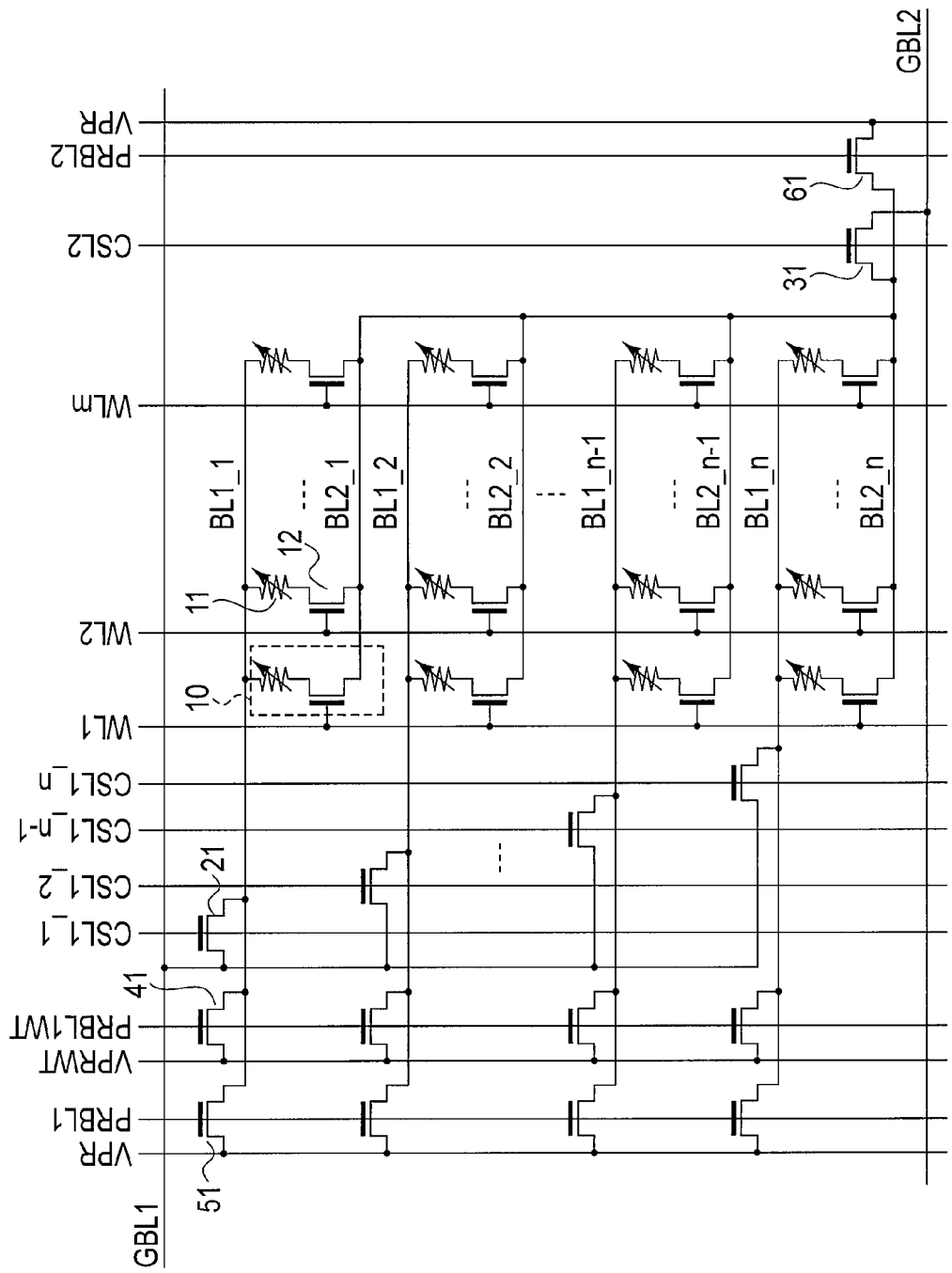
FIG. 4 is an electric circuit diagram showing a configuration of a memory device according to a first embodiment.

In general, according to one embodiment, a memory device includes: a plurality of memory cells comprising series connections of storage elements and cell transistors, and arranged in rows and columns, each of the storage elements storing information based on a change of resistance; a plurality of word lines, each word line connecting control terminals of the cell transistors provided in each row; a plurality of first bit lines, each first bit line connecting first terminals of the series connections provided in each column; a plurality of second bit lines, each second bit line connecting second terminals of the series connections provided in each column; a plurality of column selection transistors connected to the first bit lines; and a plurality of precharge transistors connected to the first bit lines. At least two of the precharge transistors are selected by a common control signal and apply a precharge voltage to at least two of the corresponding first bit lines before writing information to a selected memory cell, and the precharge voltage is the same as a voltage to be applied to at least two of the second bit lines paired with the at least two of the first bit lines.

Various embodiments will be described hereinafter with reference to the accompanying drawings.

(General Configuration)

First, a general configuration example of the memory device according to the embodiment is described.

FIG. 1 is a block diagram showing a first general configuration example of the memory device.

The memory device shown in FIG. 1 comprises a plurality of unit blocks 100. Each of the unit blocks 100 comprises a cell array block 110, a first column selection circuit 121, a second column selection circuit 122, a first write driver 131, a second write driver 132 and a sense amplifier 140. Also, a one-bit data holding portion 200 is connected to each of the unit blocks 100.

The cell array block 110 comprises a plurality of memory cells arranged in a plurality of rows and a plurality of columns. Each of the memory cells includes a resistance-change type storage element and a cell transistor connected to the storage element in series.

A first bit line (first BL) is provided between the first column selection circuit 121 and the cell array block 110, and a second bit line (second BL) is provided between the second column selection circuit 122 and the cell array block 110. Also, a first global bit line (first GBL) is provided between the first write driver 131 and the first column selection circuit 121, and a second global bit line (second GBL) is provided between the second write driver 132 and the second column selection circuit 122. Also, the sense amplifier 140 is connected to the first global bit line.

By the above structure, data held in the one-bit data holding portion 200 is written to a storage element in the cell array block 110, and the data stored in the storage element is read out to the one-bit data holding portion 200.

FIG. 2 is a block diagram showing a second general configuration example of the memory device. It should be noted that the description of the matters described in the first general configuration example is omitted.

In this configuration example, the first write driver 131 and the second write driver 132 are provided on the same side of the cell array block 110. Also, the plurality of cell array blocks 110 are connected to the first global bit line (first GBL) and the second global bit line (second GBL) through the first column selection circuit 121 and the second column selection circuit 122.

FIG. 3 is a block diagram showing a third general configuration example of the memory device. It should be noted that the description of the matters described in the first and second general configuration examples is omitted.

In this configuration example, the adjacent cell array blocks 110 share the second column selection circuit 122. This allows a circuit area to be reduced. Also, the first column selection circuit 121 can also be shared by the adjacent cell array blocks 110.

First to third embodiments are hereinafter described. It should be noted that the general configuration of the memory device according to the first to third embodiments can be realized using any of the above-described first to third general configuration examples. Also, in the following description, a magnetic memory device, specifically, a magnetic random access memory (MRAM) is used as a memory device. Also, a transistor, a storage element, wiring, etc., to be described below, are provided on the same semiconductor substrate.

(First Embodiment)

FIG. 4 is an electric circuit diagram showing a configuration of a memory device according to a first embodiment.

As shown in FIG. 4, this memory device (magnetic memory device) has a cell array block comprising a plurality of memory cells 10 arranged in a plurality of rows and a plurality of columns in a matrix. Each of the memory cells 10 comprises a storage element 11 and a cell transistor 12 which are connected in series.

The storage element 11 is a resistance-change type storage element configured to store information based on a change of resistance. Specifically, a magnetoresistive effect element (MTJ element) is used as the storage element 11. This magnetoresistive effect element comprises a storage layer (magnetic layer), a reference layer (magnetic layer) and a tunnel barrier layer (non-magnetic layer) provided between the storage layer and the reference layer. The information stored in the magnetoresistive effect element is determined based on a current flowing through the magnetoresistive effect element. Specifically, there are cases, depending on a direction of the current flowing through the magnetoresistive effect element, where a magnetization direction of the storage layer and that of the reference layer are in parallel with each other to be in a low resistance state, and where they are in antiparallel with each other to be in a high resistance state. Thus, a binary value (0 or 1) can be stored in accordance with a resistance state, depending on whether the magnetization direction of the storage layer and that of the reference layer are in parallel or antiparallel with each other.

A plurality of word lines (WL1 to WLm) are provided along the memory cells 10 arranged in the row direction. Each of the word lines WLs connects control terminals (gates) of the plurality of cell transistors 12 provided in each row.

First bit lines (BL1_1 to BL1_n) are provided along the memory cells 10 arranged in the column direction. Each of the first bit lines BLs1 connects a plurality of first terminals of the series connections provided in each column.

Second bit lines (BL2_1 to BL2_n) are provided along the memory cells 10 arranged in the column direction. Each of the second bit lines BLs2 connects a plurality of second terminals of the series connections provided in each column. Although the first terminals (terminals on the storage element side) and the second terminals (terminals on the transistor side) of the series connections are connected to the first bit line and the second bit line, respectively, the first bit line can be connected to the second terminals of the series connection, and the second bit line can be connected to the first terminals of the series connection.

A column selection transistor 21 is connected to the first bit lines BLs1. The column selection transistor 21 selects a first bit line BL1 connected to a selected memory cell 10 at the time of writing information to the selected memory cell 10.

The second bit lines BLs2 are commonly connected, and a selection transistor 31 is connected to the commonly connected second bit lines BLs2.

Column selection signal lines (CSL1_1 to CSL1_n) are connected to a control terminal (gate) of the column selection transistor 21, and a first global bit line GBL1 and the selected memory cell 10 are electrically conducted through the selected column selection transistor 21. Also, a selection signal line CSL2 is connected to a control terminal (gate) of the selection transistor 31, and a second global bit line GBL2 and the selected memory cell 10 are electrically conducted through the selection transistor 31. Thus, a current path of the first global bit line GBL1, the selected column selection transistor 21, the first bit line BL1, the selected memory cell 10, the second bit line BL2, the selection transistor 31 and the second global bit line GBL2 can be formed. Thus, writing can be performed in the memory cell 10 using this current route.

Also, a precharge transistor 41 is connected to the first bit line BL1. The precharge transistor 41 applies a precharge voltage to the first bit line BL1 before writing information to the selected memory cell 10. A precharge control signal line PRBL1WT is connected to a control terminal (gate) of the precharge transistor 41. In this embodiment, a common precharge control signal line PRBL1WT is connected to all the precharge transistors 41 shown in FIG. 4. Thus, the common (same) precharge control signal is applied to all the precharge transistors 41 shown in FIG. 4. When the precharge transistor 41 is selected by the precharge control signal, a precharge line VPRWT and the first bit line BL1 are electrically conducted through the precharge transistor 41. As a result, the first bit line BL1 can be precharged through the precharge transistor 41.

Also, the precharge voltage to be applied to the first bit line BL1 is equal to the voltage to be applied to the second bit line BL2 paired with the first bit line. Thus, the precharge operation allows the voltage of the first bit line BL1 to be equal to that of the second bit line BL2.

Also, when information is written to the selected memory cell, the same voltage as the precharge voltage is applied to the second bit line BL2. Thus, when the information is written to the selected memory cell, the voltage of the first bit line BL1 which is not connected to the selected memory cell can be equal to that of the second bit line BL2.

Also, a standby precharge transistor 51 is connected to the first bit line BL1. The standby precharge transistor 51 applies a standby precharge voltage to the first bit line BL1 in a standby period. A standby precharge line VPR and the first bit line BL1 are electrically conducted by keeping the standby precharge transistor 51 in a conduction state in the standby period using a control signal from a standby precharge control signal line PRBL1. As a result, a standby precharge can be performed on the first bit line BL1.

Also, as described above, the second bit line BL2 is commonly connected, and a standby precharge transistor 61 is connected to the commonly connected second bit line BL2. The standby precharge line VPR and the second bit line BL2 are electrically conducted by keeping the standby precharge transistor 61 in the conduction state in the standby period using the control signal from a standby precharge control signal line PRBL2. As a result, the standby voltage can be applied to the second bit line BL2.

Figure 5:
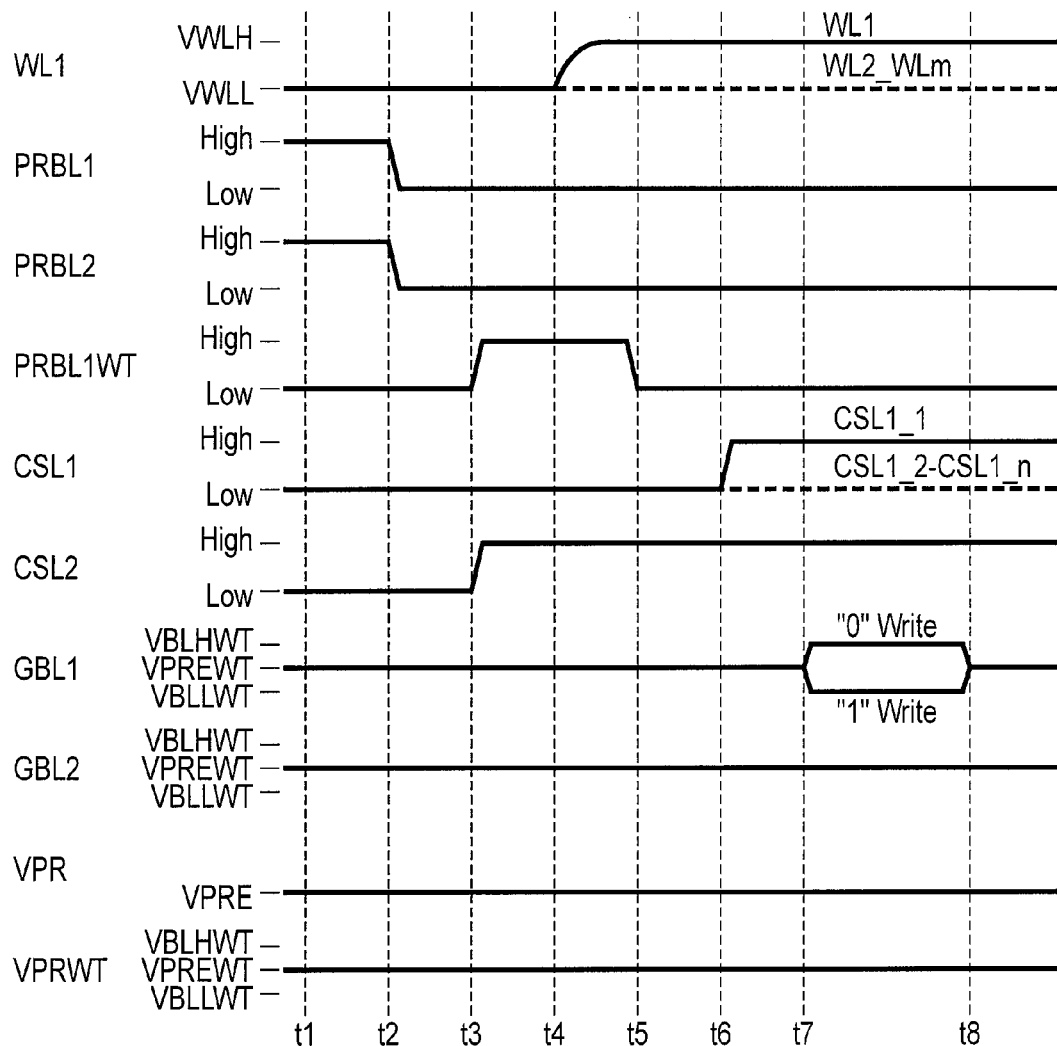
FIG. 5 is a timing chart showing operations of the first embodiment.

Next, operations of this embodiment are described. FIG. 5 is a timing chart showing the operations of this embodiment. It should be noted that information is written to the memory cell (selected memory cell) 10 at the upper left corner of FIG. 4 in the following description.

First, the standby precharge is performed until time t2. That is, a high voltage (on-voltage) is applied to the standby precharge control signal lines PRBL1 and PRBL2 until time t2. Since a voltage VPRE is applied to the standby precharge line VPR, the voltage VPRE is applied to both the first bit line BL1 and the second bit line BL2.

At time t3, a precharge period starts. That is, the voltage of the precharge control signal line PRBL1WT becomes high, and the precharge transistor 41 turns on. As a result, an intermediate voltage VPREWT is applied from the precharge line VPRWT to the first bit line BL1. In this embodiment, the voltage of the precharge line VPRWT is always fixed to the intermediate voltage VPREWT. Also, the voltage of the selection signal line CSL2 becomes high, and the selection transistor 31 turns on. As a result, the intermediate voltage VPREWT is applied from the second global bit line GBL2 to the second bit line BL2. Thus, the same voltage is applied to the first bit line BL1 and the second bit line BL2. It should be noted that the intermediate voltage VPREWT can be equal to the standby precharge voltage VPRE.

At time t4, a voltage VWLH is applied to the word line WL1, and the cell transistor 12 connected to the word line WL1 turns on. Since the first bit line BL1 and the second bit line BL2 have the same voltage level at this moment, no current flows to a storage element 10 even if the cell transistor 12 connected to the word line WL1 turns on.

At time t5, the precharge period terminates. That is, the voltage of the precharge control signal line PRBL1WT becomes low, and the precharge transistor 41 turns off. After the precharge transistor 41 turns off, the voltage level of the first bit line BL1 is kept to be the intermediate voltage VPREWT. Also, the voltage level of the second bit line BL2 is fixed to the intermediate voltage VPREWT. Thus, no current flows to the storage element 10 connected to the word line WL1.

At time t6, the column selection signal line CSL1_1 becomes high. As a result, the column selection transistor 21 connected to the column selection signal line CSL1_1 turns on. Thus, the first global bit line GBL1 and the first bit line BL1_1 are electrically conducted. At this time, also, the voltage levels of the non-selective first bit lines BL1_2 to BL1_n are kept to be the intermediate voltage VPREWT. Also, the voltage level of the second bit line BL2 stays fixed to the intermediate voltage VPREWT. That is, although all the memory cells connected to the word line WL1 turns on, the first bit line BL1 and the second bit line BL2 of a cell connected to the lines other than the first bit line BL1_1 have the same voltage level. Thus, no current flows to the storage element 10 in all the memory cells other than the memory cell (selected memory cell) connected to the word line WL1 and the first bit line BL1_1.

At time t7, the writing period starts. That is, a voltage is supplied to the first global bit line GBL1 in accordance with write data (0 or 1). At this moment, the current route of the first global bit line GBL1, the selected column selection transistor 21, the first bit line BL1_1, the selected memory cell (selected memory cell) 10, the second bit line BL2_1, the selection transistor 31 and the second global bit line GBL2 is formed. As a result, a binary value (0 or 1) is written to the storage element 11 of the selected memory cell 10. Here, for convenience, the binary value to be written by supplying a current from the first bit line to the second bit line is 0, and, in contrast, the binary value to be written by supplying a current from the second bit line to the first bit line is 1.

At time t8, the writing period terminates. Both voltage levels of the non-selective first bit lines BL1_2 to BL1_n and those of the second bit lines BLs2 are the intermediate voltage VPREWT also in the period from time t7 to time t8. Thus, no current flows to the storage element 11 in all the memory cells other than the selected memory cell (selected memory cell).

A binary value (0 or 1) is written to the storage element 11 in the selected memory cell 10 in the above manner.

As described above, in this embodiment, all the first bit lines BLs1 are precharged in the precharge period (time t3 to time t5). It should be noted that the precharge voltage to be applied to the first bit line BL1 is the same as the voltage to be applied to the second bit line BL2. The voltage levels of the first bit lines BLs1 other than that connected to the memory cell (selected memory cell) to be written are kept at the same voltage level as the second bit line BL2 also during writing. Thus, no current flows to the memory cells other than the selected memory cell. Accordingly, none of the memory cells other than that to be written is erroneously written. Thus, a memory device having high reliability can be obtained. Further description is provided below.

If precharging is not performed, the voltage levels of the first bit lines BLs1 other than that connected to the selected memory cell are sometimes different from the voltage level of the second bit line BL2. Also, the cell transistors 12 of the other memory cells connected to the word line WL1 connected to the selected memory cell also turn on. Thus, if the voltage level of the first bit line BL1 is different from that of the second bit line BL2, a current flows to the cell transistors 12 of the memory cells other than the selected memory cell. As a result, the storage elements 11 of the memory cells other than the selected memory cell may be erroneously written. This embodiment can prevent such a problem, and a memory device having high reliability can be obtained.

Also in this embodiment, the common precharge control signal line PRBL1WT is connected to the plurality of precharge transistors 41, and the common (same) precharge control signal is applied to the plurality of precharge transistors 41. Thus, the precharging is easily controlled. Also, the layouts of the precharge control signal line PRBL1WT and the precharge line VPRWT can be simplified.

It should be noted that in the above-described embodiment, the selection transistor 31 can be omitted, and the standby precharge transistor 61 can be included in a write driver of FIG. 1. In this case, the commonly connected second bit line BL2 can also be directly connected to the second global bit line GBL2.

(First Modified Embodiment)

FIG. 6 is an electric circuit diagram showing a configuration of a memory device according to a first modified embodiment in this embodiment. It should be noted that since the basic structure is similar to that of the above-described embodiment, the structural elements corresponding to those shown in FIG. 4 are denoted by the same reference numbers as in FIG. 4, and the description of the matters described in the embodiment is omitted.

In the above-described embodiment, the common precharge control signal line PRBL1WT was connected to all the precharge transistors 41, and the common (same) precharge control signal was applied to all the precharge transistors 41. In this modified embodiment, the precharge transistors 41 are grouped, the common precharge control signal lines PRBL1WT (PRBL1WT_1 to PRBL1WT_n/2) are connected to the grouped precharge transistor 41, and the common (same) precharge control signal is applied to the grouped precharge transistor 41.

Also, in association with the grouping of the precharge transistors 41, the selection transistor 31, the selection signal lines CSL2 (CSL2_1 to CSL2_$n$/2) and the standby precharge transistor 61 are provided for each group.

Next, operations of this modified embodiment are described. FIG. 7 is a timing chart showing operations of this modified embodiment. It should be noted that since the basic operations are similar to those of the above-described embodiment, the description of the matters described in the embodiment is omitted. Also, information is written to the memory cell 10 (selected memory cell) at the upper left corner of FIG. 4, in a similar manner to the above-described embodiment.

In this modified embodiment, in the precharge period starting at time t3, the precharge transistor 41 connected to the precharge control signal line PRBL1WT_1 is on, and the other precharge transistors 41 are off. Also, at time t3, the selection transistor 31 connected to the selection signal line CSL2_1 is on, and the other selection transistors 31 are off.

As a result, in the precharge period from time t3 to time t5, only the selected first bit lines BL1_1 and BL1_2 are precharged. Also, only the selected second bit lines BL2_1 and BL2_2 are precharged. The intermediate voltage VPREWT is applied from the precharge line VPRWT to the selected first bit lines BL1_1 and BL1_2. Also, the intermediate voltage VPREWT is applied from the second global bit line GBL2 to the selected second bit lines BL2_1 and BL2_2. Thus, no current flows to the memory cells other than the memory cell (selected memory cell) to be written in the writing period in the same manner as in the above-described embodiment.

Also in this modified embodiment, an advantage similar to that of the above-described embodiment can be obtained. Also, since precharging is performed for a grouped unit in this modified embodiment, a capacitive load during precharging can be reduced.

It should be noted that if the structures of the above-described embodiment and the first modified embodiment are generalized, at least two of the precharge transistors 41 should be selected by the common precharge control signal line PRBL1WT, and a precharge voltage should be applied to at least two of the corresponding first bit lines BLs1 before writing information to the selected memory cell 10. Then, the precharge voltage should be identical to the voltage to be applied to at least two of the second bit lines BLs2 paired with the at least two first bit lines BLs1.

(Second Modified Embodiment)

Figure 8:
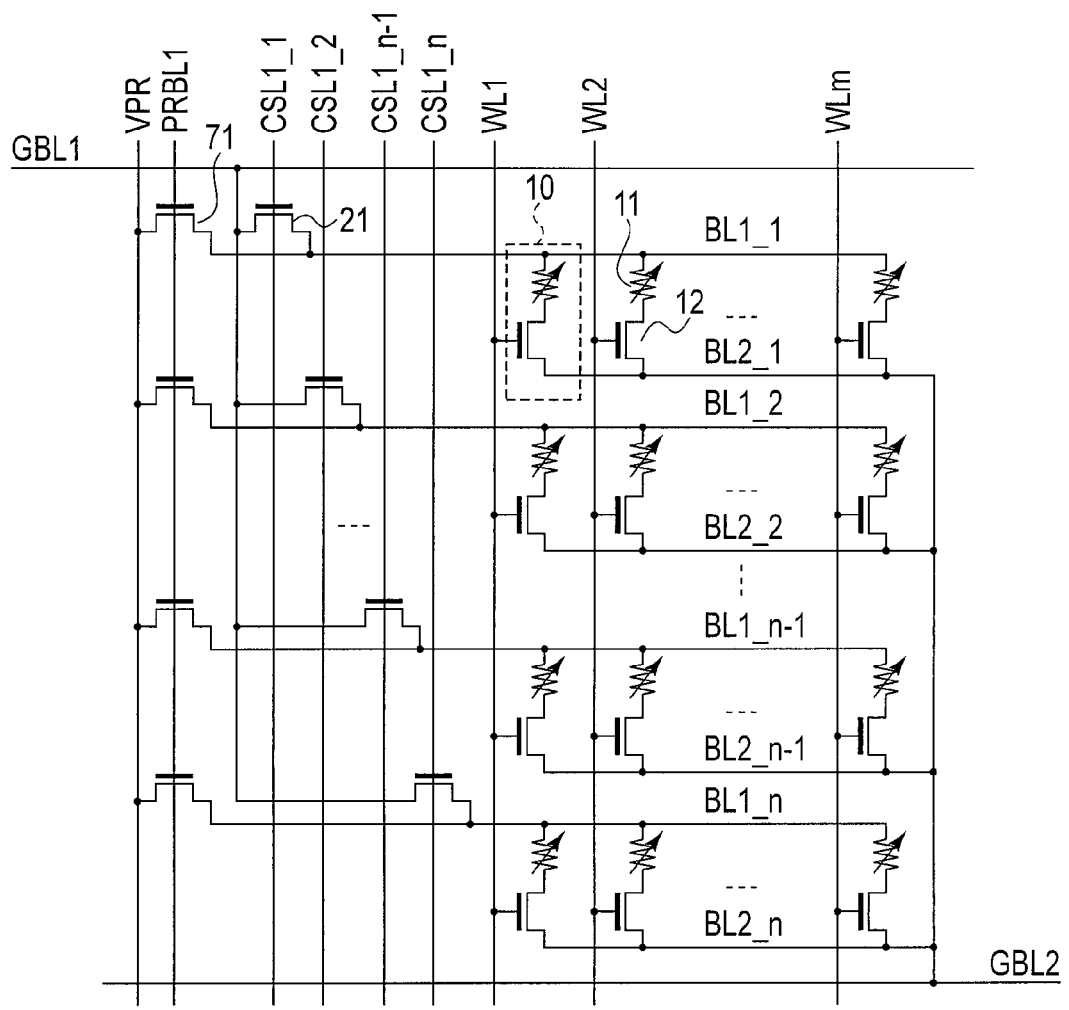
FIG. 8 is an electric circuit diagram showing a configuration of a memory device according to a second modified embodiment in the first embodiment.

FIG. 8 is an electric circuit diagram showing a configuration of a memory device according to a second modified embodiment of this embodiment. It should be noted that since the basic structure is similar to that of the above-described embodiment, the structural elements corresponding to those shown in FIG. 4 are denoted by the same reference numbers as in FIG. 4, and the description of the matters described in the embodiment is omitted.

In this modified embodiment, a precharge transistor 71 obtained by merging the precharge transistor 41 and the standby precharge transistor 51 shown in FIG. 4 is provided. Also, the selection transistor 31 and the standby precharge transistor 61 shown in FIG. 4 are omitted. The precharge control signal line (standby precharge control signal line) PRBL1 is connected to the control terminal (gate) of the precharge transistor 71. The precharge line (standby precharge line) VPR is connected to the input terminal of the precharge transistor 71. Also, the second global bit line GBL2 is connected to the second bit lines BLs2. If the voltage level of the second global bit line GBL2 is fixed, a configuration as in this modified embodiment can be adopted.

Figure 9:
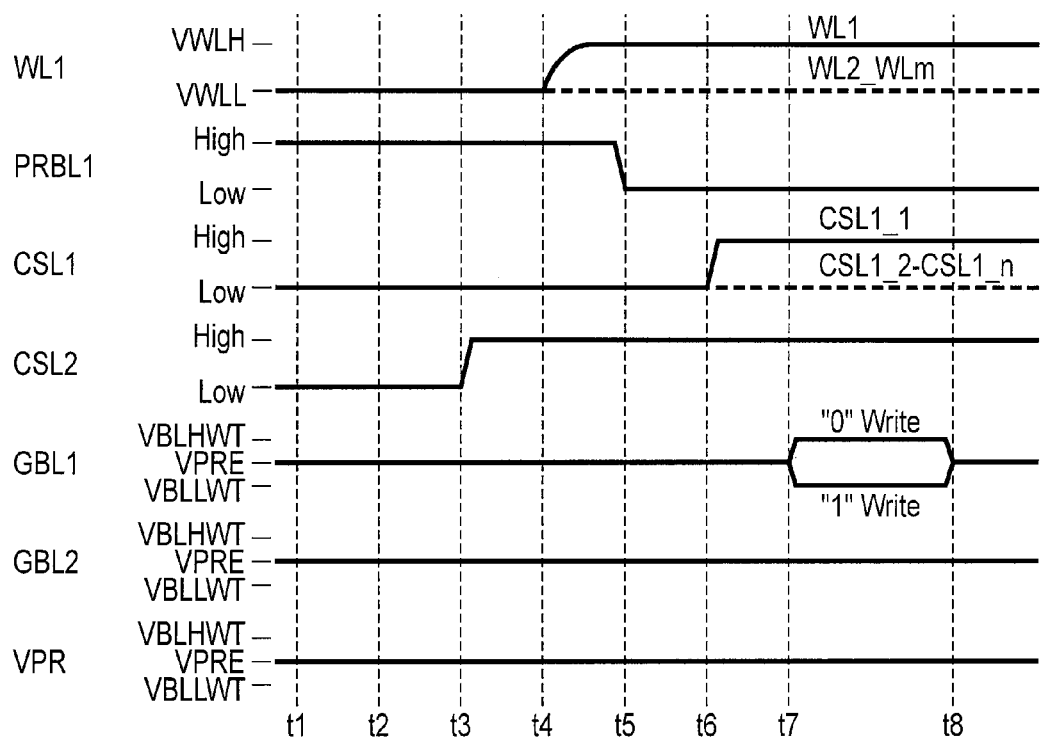
FIG. 9 is a timing chart showing operations of the second modified embodiment in the first embodiment.

Next, operations of this modified embodiment are described. FIG. 9 is a timing chart showing the operations of this modified embodiment. It should be noted that since the basic operations are similar to those of the above-described embodiment, the description of the matters described in the embodiment is omitted.

In this modified embodiment, since the precharge transistor 71 is provided by merging the precharge transistor 41 and the standby precharge transistor 51, a selection signal (on-signal) is supplied to the precharge control signal line (standby precharge control signal line) PRBL1 until time t5.

Also in this modified embodiment, an advantage similar to that of the above-described embodiment can be obtained. Also, the circuit configuration can be simplified in this modified embodiment.

(Third Modified Embodiment)

FIG. 10 is an electric circuit diagram showing a configuration of a memory device according to a third modified embodiment in this embodiment. It should be noted that since the basic structure is similar to that of the above-described embodiment, the structural elements corresponding to those shown in FIG. 4 are denoted by the same reference numbers as in FIG. 4, and the description of the matters described in the embodiment is omitted.

Also in this modified embodiment, the precharge transistor 71 obtained by merging the precharge transistor 41 and the standby precharge transistor 51 shown in FIG. 4 is provided in the same manner as in the above-described second modified embodiment. Thus, the basic structure is similar to that of the second modified embodiment, and the description of the matters described in the second modified embodiment is omitted.

Although the precharge line (standby precharge line) VPR was connected to the input terminal of the precharge transistor 71 in the above-described second modified embodiment, the second global bit line GBL2 is connected to the input terminal of the precharge transistor 71 in this modified embodiment. This modified embodiment can also be adopted when the voltage level of the second global bit line GBL2 is fixed.

The operations of this modified embodiment are similar to those of the second modified embodiment shown in FIG. 9. Thus, the description of the operations is omitted.

Also in this modified embodiment, an advantage similar to that of the above-described embodiment can be obtained. Also, the circuit configuration can be simplified in this modified embodiment.

(Fourth Modified Embodiment)

FIG. 11 is an electric circuit diagram showing a configuration of a memory device according to a fourth modified embodiment in this embodiment. It should be noted that since the basic structure is similar to that of the above-described embodiment, the structural elements corresponding to those shown in FIG. 4 are denoted by the same reference numbers as in FIG. 4, and the description of the matters described in the embodiment is omitted.

Also in this modified embodiment, a precharge transistor 81 obtained by merging the precharge transistor 41 and the standby precharge transistor 51 shown in FIG. 4 is provided.

Also, control transistors 91 and 92 are provided in this modified embodiment. The precharge control signal line PRBL1WT is connected to the control terminal of the control transistor 91, and a standby precharge control signal line PRBLSBY is connected to the control terminal of the control transistor 92. Also, the precharge line VPRWT is connected to the input terminal of the control transistor 91, and the standby precharge line VPR is connected to the input terminal of the control transistor 92. Such a structure allows either the voltage of the precharge line VPRWT or the voltage of the standby precharge line VPR to be selectively supplied to the precharge transistor 81 in this modified embodiment.

Figure 12:
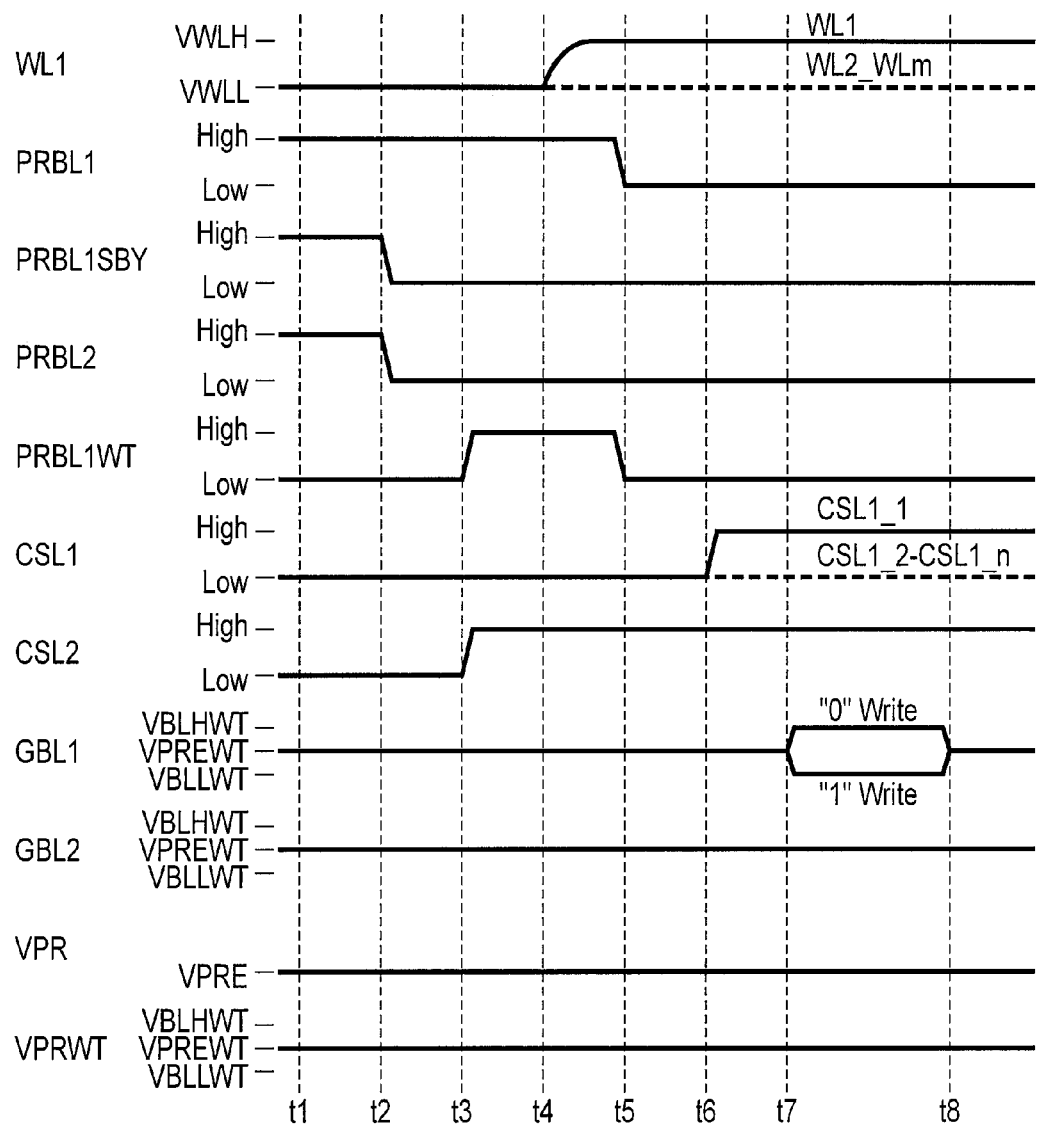
FIG. 12 is a timing chart showing operations of the fourth modified embodiment in the first embodiment.

Next, operations of this modified embodiment are described. FIG. 12 is a timing chart showing the operations of this modified embodiment. It should be noted that since the basic operations are similar to those of the above-described embodiment, the description of the matters described in the embodiment is omitted.

Since the precharge transistor 81 is provided by merging the precharge transistor 41 and the standby precharge transistor 51 in this modified embodiment, a selection signal (on-signal) is supplied to the precharge control signal line (standby precharge control signal line) PRBL1 until time t5. It should be noted that if the precharge control signal line PRBL1WT has a low voltage, and the control transistor 91 is off, the selection signal (on-signal) can be continuously supplied to the precharge control signal line (standby precharge control signal line) PRBL1 also after time t5.

Also in this modified embodiment, an advantage similar to that of the above-described embodiment can be obtained. Also, the circuit configuration can be simplified in this modified embodiment.

(Fifth Modified Embodiment)

FIG. 13 is an electric circuit diagram showing a configuration of a memory device according to a fifth modified embodiment in this embodiment. It should be noted that since the basic structure is similar to that of the above-described embodiment, the structural elements corresponding to those shown in FIG. 4 are denoted by the same reference numbers as in FIG. 4, and the description of the matters described in the embodiment is omitted.

Also in this modified embodiment, the precharge transistor 81 obtained by merging the precharge transistor 41 and the standby precharge transistor 51 shown in FIG. 4 is provided in the same manner as in the above-described fourth modified embodiment. Thus, the basic structure is similar to that of the fourth modified embodiment, and the description of the matters described in the fourth modified embodiment is omitted.

Although the precharge line VPRWT was connected to the input terminal of the control transistor 91 in the above-described fourth modified embodiment, the second global bit line GBL2 is connected to the input terminal of the control transistor 91 in this modified embodiment.

The operations of this modified embodiment are similar to those of the fourth modified embodiment shown in FIG. 12. Thus, the description of the operations is omitted.

Also in this modified embodiment, an advantage similar to that of the above-described embodiment can be obtained. Also, the circuit configuration can be simplified in this modified embodiment.

(Second Embodiment)

Figure 14:
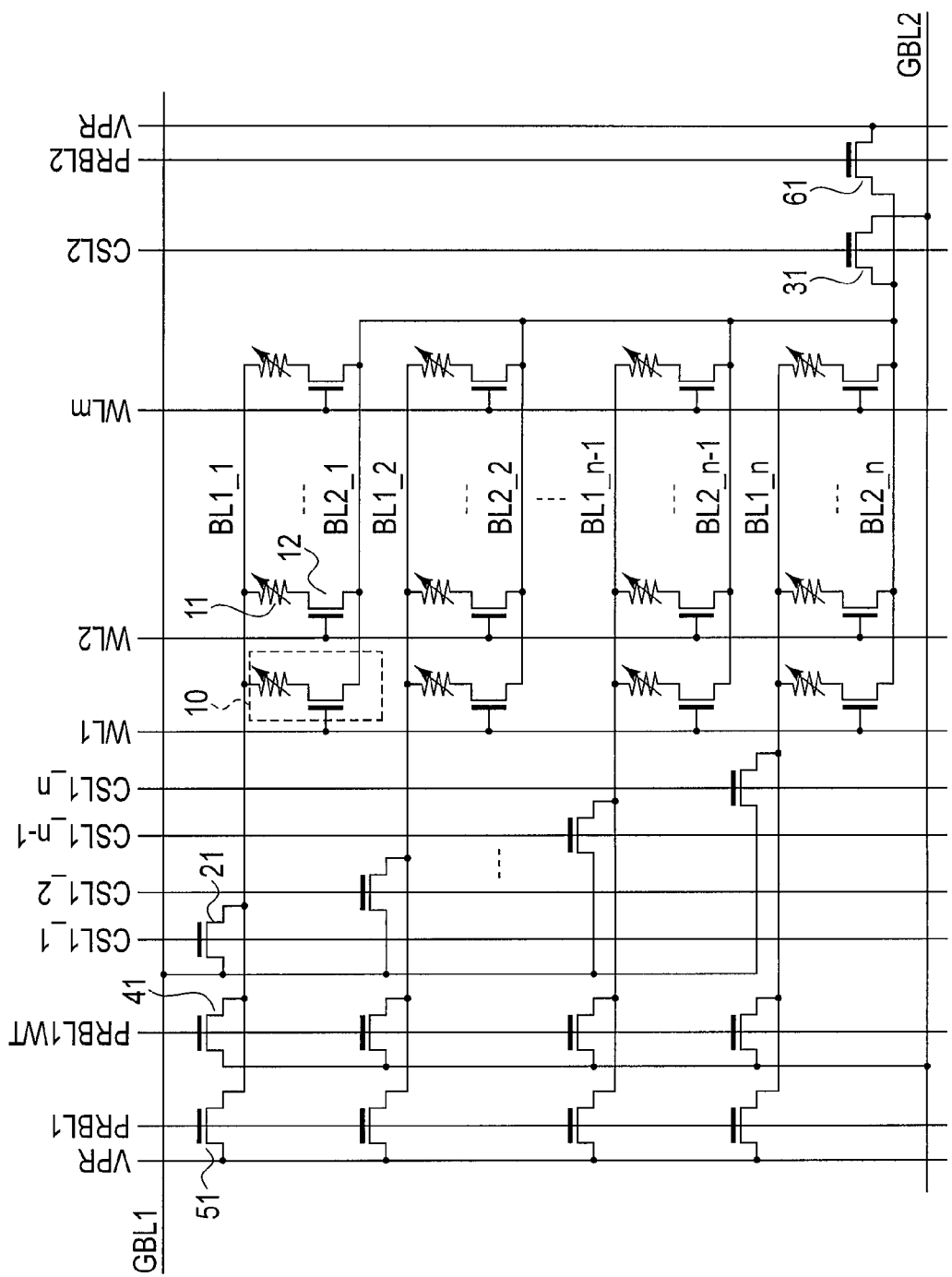
FIG. 14 is an electric circuit diagram showing a configuration of a memory device according to a second embodiment.

FIG. 14 is an electric circuit diagram showing a configuration of a memory device according to a second embodiment. It should be noted that since the basic structure is similar to that of the above-described first embodiment, the structural elements corresponding to those shown in FIG. 4 are denoted by the same reference numbers as in FIG. 4, and the description of the matters described in the first embodiment is omitted.

Although the precharge line VPRWT was connected to the precharge transistor 41 in the above-described first embodiment as shown in FIG. 4, the second global bit line GBL2 is connected to the precharge transistor 41 in this embodiment, as shown in FIG. 14. Thus, the precharge voltage is supplied from the second global bit line GBL2 to the first bit line BL1 in the precharge period. Then, the precharge voltage has a polarity according to information to be written to a selected memory cell in this embodiment.

Figure 15:
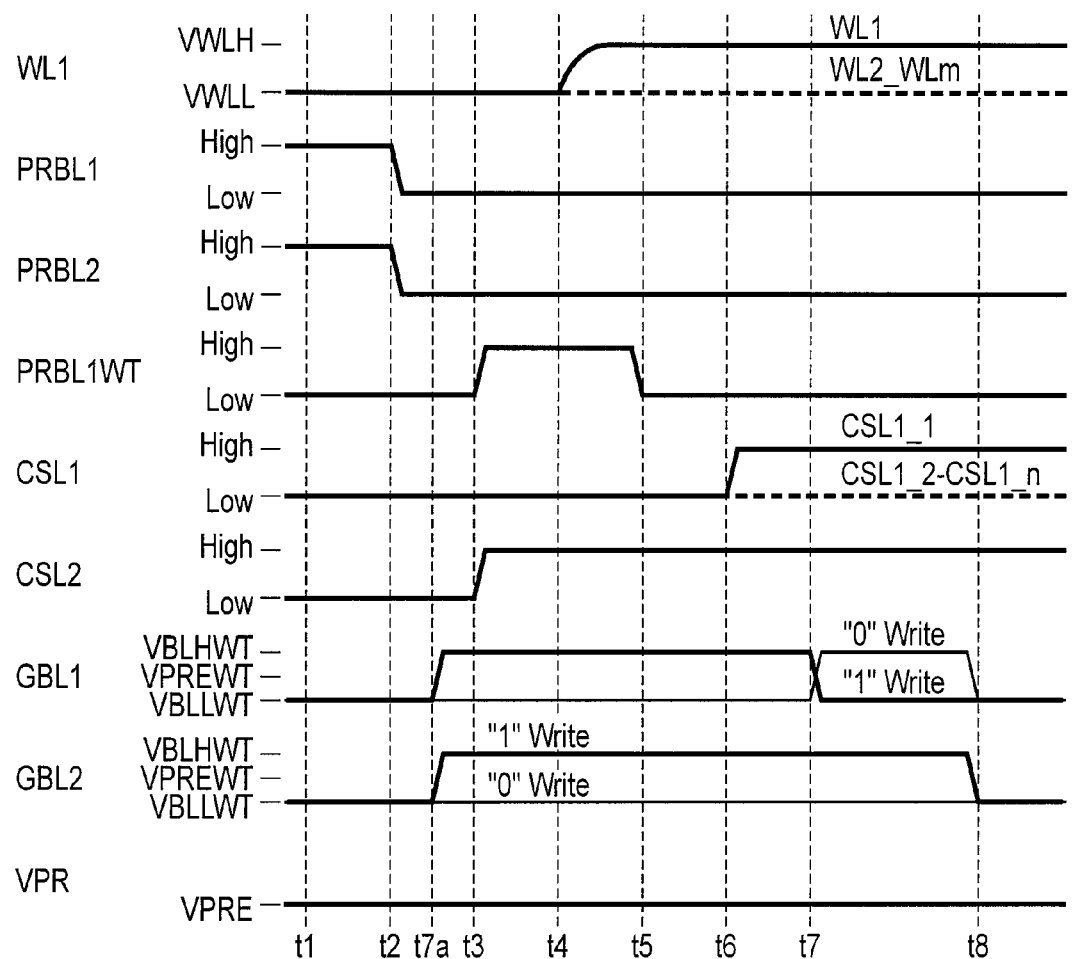
FIG. 15 is a timing chart showing operations of the second embodiment.

Next, operations of this embodiment are described. FIG. 15 is a timing chart showing the operations of the second embodiment. It should be noted that since basic operations are similar to those of the above-described first embodiment, the description of the matters described in the first embodiment is omitted.

In this embodiment, a precharge voltage having a polarity according to information to be written to a selected memory cell is applied to the second global bit line GBL2 at time t7a. Then, precharging starts at time t3. Specifically, the precharge voltage has a polarity opposite to the voltage polarity to be applied to the first global bit line GBL1 according to the information to be written to a selected memory cell, and has the same level of voltage as that to be applied to the second global bit line GBL2 in the writing period.

For example, if the voltage polarity according to the information to be written from the first global bit line GBL1 to the selected memory cell is positive (voltage VBLHWT) relative to a predetermined voltage (voltage VPREWT) in the writing period (time t7 to time t8), the precharge voltage to be applied to the second global bit line GBL2 has a negative voltage polarity (voltage VBLLWT) relative to the predetermined voltage (voltage VPREWT). Also, if the voltage polarity according to the information to be written from the first global bit line GBL1 to the selected memory cell is negative (voltage VBLLWT) relative to a predetermined voltage (voltage VPREWT) in the writing period (time t7 to time t8), the precharge voltage to be applied to the second global bit line GBL2 has a positive voltage polarity (voltage VBLHWT) relative to the predetermined voltage (voltage VPREWT).

The same precharge voltage is supplied from the second global bit line GBL2 to the first bit line BL1 and the second bit line BL2 in this manner in the precharge period (time t3 to time t5).

A voltage having a polarity opposite to the precharge voltage is applied from the first global bit line GBL1 to a selected memory cell in the writing period (time t7 to time t8). Thus, a voltage twice larger than that of the first embodiment is applied to the selected memory cell. That is, a voltage twice larger than that of the first embodiment is applied between the first bit line BL1 and the second bit line BL2 to which the selected memory cell is connected. Thus, a necessary write current can be achieved with a low power source voltage.

On the other hand, the same precharge voltage is applied to the first bit line BL1 and the second bit line BL2 to which the selected memory cell is not connected. Thus, no current flows, in the writing period, between the first bit line BL1 and the second bit line BL2 to which the selected memory cell is not connected.

It should be noted that the column selection transistor 41 is turned on at time t6 by the column selection signal line CSL1 after the precharge period terminates. However, a selection signal can be supplied to the signal line CSL1 at the same time (t3) as the signal line CSL2 since the voltage of the first global bit line GBL1 is equal to that of the second global bit line GBL2 from time t7a to time t7.

As described above, no current flows to the memory cells other than the memory cell (selected memory cell) to be written also in this embodiment in the same manner as in the first embodiment. As a result, none of the memory cells other than the memory cell (selected memory cell) to be written is erroneously written. Thus, a memory device having high reliability can be obtained.

Also, a voltage twice larger than that of the first embodiment can be applied to the selected memory cell in the writing period in this embodiment. Thus, low-voltage operation can be performed since a necessary write current can be achieved with a low power source voltage.

(Modified Embodiment)

Next, operations of a modified embodiment of the second embodiment are described. FIG. 16 is a timing chart showing the operations of this modified embodiment. It should be noted that since the basic structure and the basic operations are similar to those of the above-described embodiment, the description of the matters described in the embodiment is omitted.

In the above-described embodiment, the voltage to be applied to the first global bit line GBL1 was different between the period from time t7a to time t7 and the period from time t7 to time t8. In this modified embodiment, the voltage to be applied to the first global bit line GBL1 in the period from time t7a to time t7 is the same as that in the period from time t7 to time t8. Thus, a voltage application operation can be performed on the global bit line GBL1 and the global bit line GBL2 at the same time. Also, the writing period of the memory cell is from time t6 to time t8. The other basic operations are similar to those of the above-described embodiment.

An advantage similar to that of the above-described embodiment can be obtained also in this modified embodiment.

It should be noted that in this embodiment, a common precharge control signal is not necessarily applied to all the precharge transistors. If the above-described embodiment including such a case is generalized, a precharge voltage having a polarity according to the information to be written to the selected memory cell 10 should be applied to at least two of the corresponding first bit lines BLs1, by at least two of the precharge transistors 41 before writing information to the selected memory cell 10. Then, the precharge voltage should be identical to the voltage to be applied to at least two of the second bit lines BLs2 paired with the at least two first bit lines BLs1.

Various modified embodiments as described in the first embodiment can be adopted also in this embodiment.

(Third Embodiment)

Figure 17:
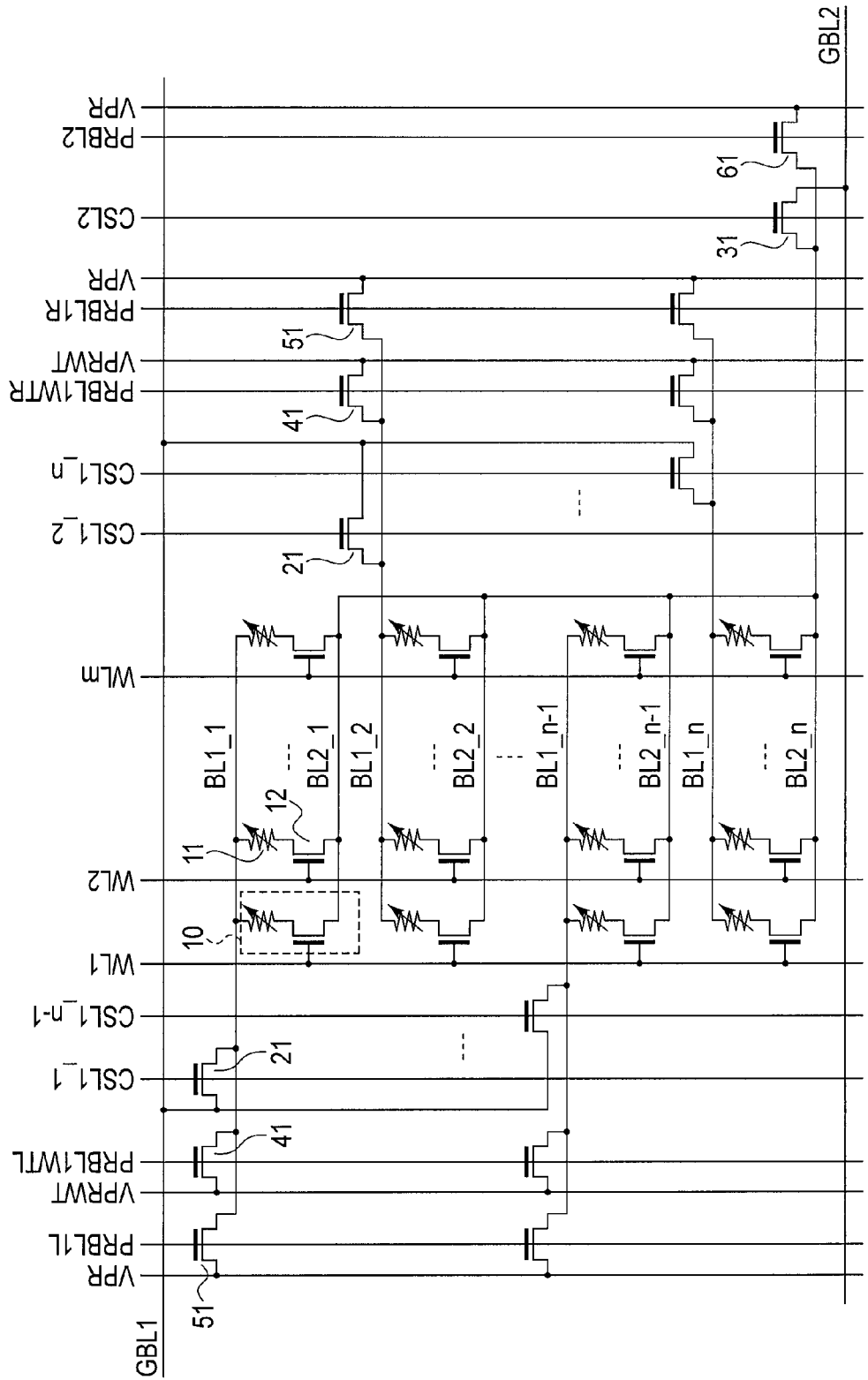
FIG. 17 is an electric circuit diagram showing a configuration of a memory device according to a third embodiment.

FIG. 17 is an electric circuit diagram showing a configuration of a memory device according to a third embodiment. It should be noted that the basic structure is similar to that of the above-described first embodiment, the structural elements corresponding to those shown in FIG. 4 are denoted by the same reference numbers as in FIG. 4, and the description of the matters described in the first embodiment is omitted.

Although the plurality of first bit lines BLs1 were led only from one side of a cell array block including the plurality of memory cells 10 in the above-described first embodiment, the plurality of first bit lines BLs1 are alternately led from the side (left side) and the other side (right side) of the cell array block in this embodiment as shown in FIG. 17.

Specifically, the odd-numbered first bit lines BL1_1, BL1_3, . . . are led from the left side of the cell array block, and the even-numbered first bit lines BL1_2, BL1_4, . . . are led from the right side of the cell array block.

Also, the column selection transistor 21, the precharge transistor 41 and the standby precharge transistor 51 are also alternately arranged on the side (left side) and the other side (right side) of the cell array block.

The precharge control signal line PRBL1WTL is connected to the precharge transistor 41 arranged on the left side of the cell array block. The precharge control signal line PRBL1WTR is connected to the precharge transistor 41 arranged on the right side of the cell array block. A common precharge signal is supplied to the precharge control signal lines PRBL1WTL and PRBL1WTR.

Figure 18:
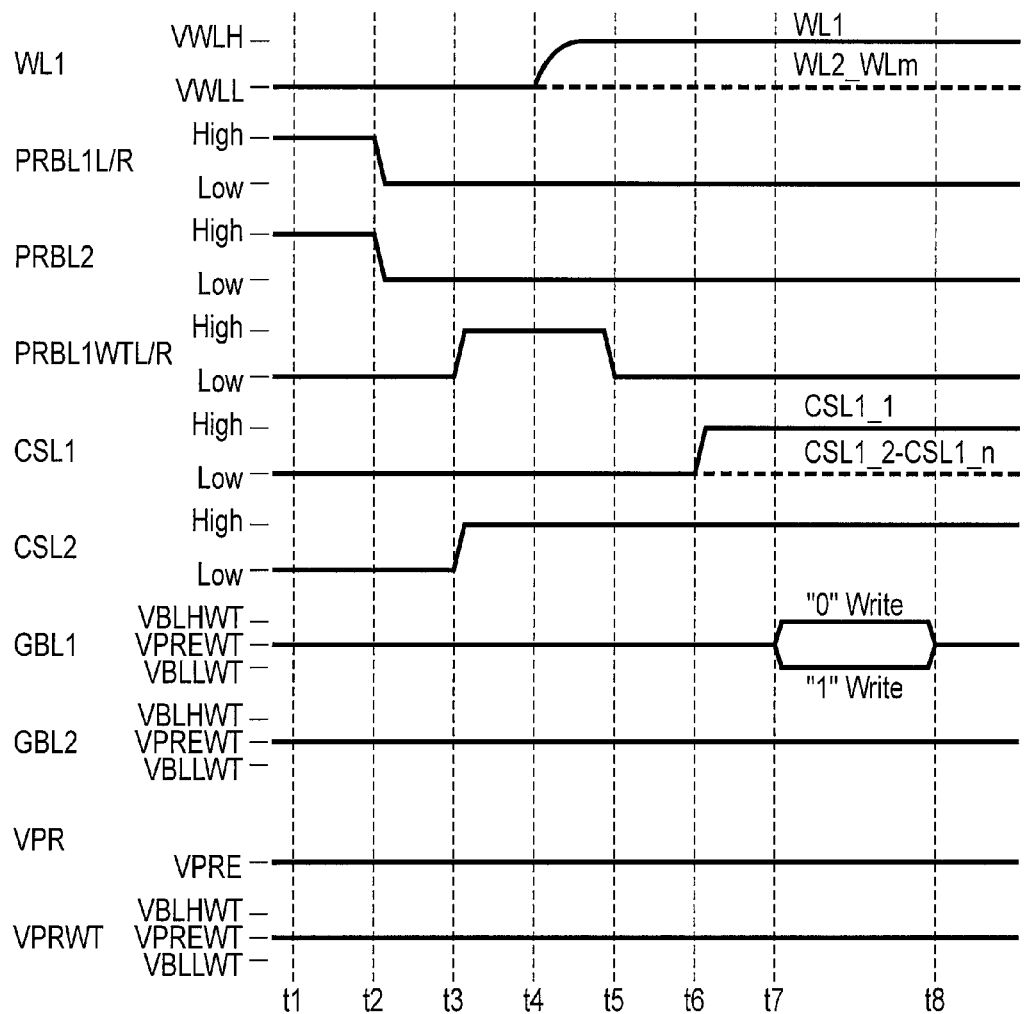
FIG. 18 is a timing chart showing operations of the third embodiment.

FIG. 18 is a timing chart showing operations of this embodiment. As can be seen from FIGS. 5 and 18, the operations of this embodiment shown in FIG. 18 are similar to those of the first embodiment shown in FIG. 5. Thus, the description of the operations of this embodiment is omitted.

Also in this embodiment, no current flows to memory cells other than the memory cell (selected memory cell) to be written in the same manner as in the first embodiment. As a result, none of the memory cells other than the memory cell (selected memory cell) to be written is erroneously written. Thus, a memory device having high reliability can be obtained.

Also, the first bit line BL1 is alternately led from one side (left side) and the other side (right side) of a cell array block in this embodiment. Thus, a pitch of the first bit line can be doubled compared to the first embodiment in which the first bit line is led only from one side of the cell array block.

Also, the column selection transistor 21, the precharge transistor 41 and the standby precharge transistor 51 as well as the first bit line are alternately arranged on one side (left side) and the other side (right side) of the cell array block in this embodiment. Thus, arrangement pitches of these transistors are also relieved, and the transistors can be arranged easier than in the first embodiment.

(First Modified Embodiment)

Figure 19:
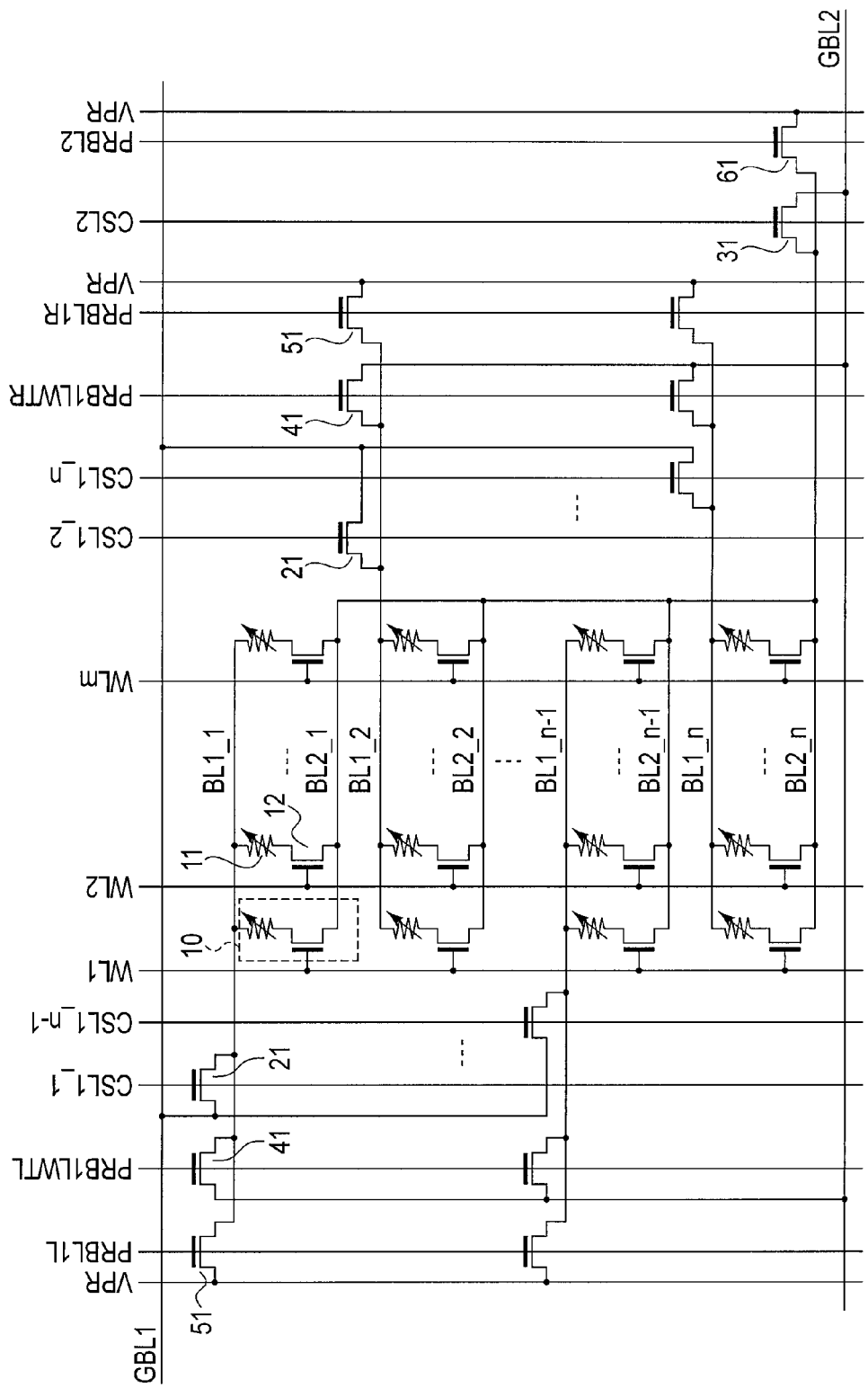
FIG. 19 is an electric circuit diagram showing a configuration of a memory device according to a first modified embodiment in the third embodiment.

FIG. 19 is an electric circuit diagram showing a configuration of a memory device according to a first modified embodiment in the third embodiment. It should be noted that since the basic structure is similar to that of the above-described embodiment, the structural elements corresponding to those shown in FIG. 17 are denoted by the same reference numbers as in FIG. 17, and the description of the matters described in the embodiment is omitted.

In brief, this modified embodiment corresponds to the combination of the second and third embodiments. That is, in this modified embodiment, the second global bit line GBL2 is connected to the precharge transistor 41 in the same manner as in the second embodiment. Thus, in the precharge period, the precharge voltage is supplied from the second global bit line GBL2 to the first bit line BM. Then, the precharge voltage has a polarity according to the information to be written to the selected memory cell in the same manner as in the second embodiment.

FIG. 20 is a timing chart showing operations of this modified embodiment. As can be seen from FIGS. 15 and 20, the operations of this modified embodiment shown in FIG. 20 are similar to those of the second embodiment shown in FIG. 15. Thus, the operations of this modified embodiment are omitted.

Also in this modified embodiment, an advantage similar to that of the above-described embodiment can be obtained. Also, an advantage similar to that of the second embodiment can be obtained in this modified embodiment.

(Second Modified Embodiment)

Figure 21:
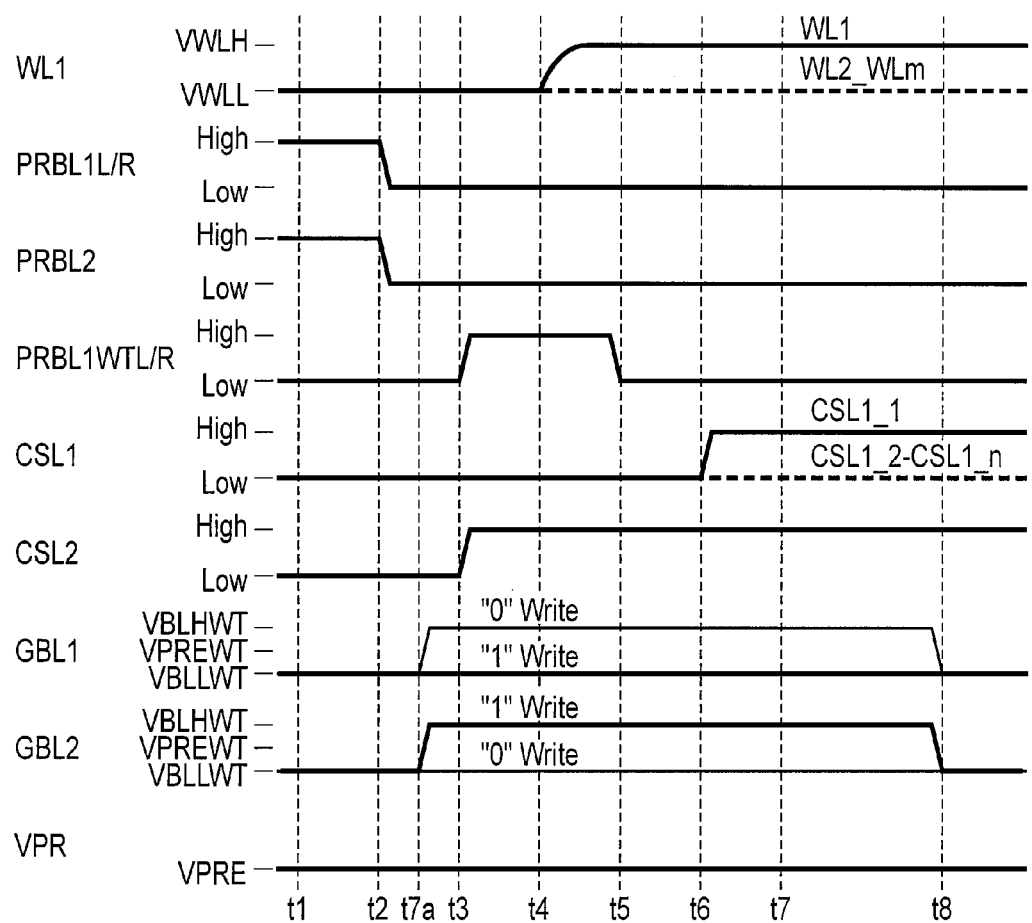
FIG. 21 is a timing chart showing operations of a second modified embodiment in the third embodiment.

FIG. 21 is a timing chart showing operations of this modified embodiment. As can be seen from FIGS. 16 and 21, the operations of this modified embodiment shown in FIG. 21 are similar to those of the modified embodiment of the second embodiment shown in FIG. 16. Thus, the description of the operations of this modified embodiment is omitted.

Also in this modified embodiment, an advantage similar to that of the above-described embodiment can be obtained. Also, an advantage similar to that of the second embodiment can be obtained in this modified embodiment.

(Third Modified Embodiment)

Figure 22:
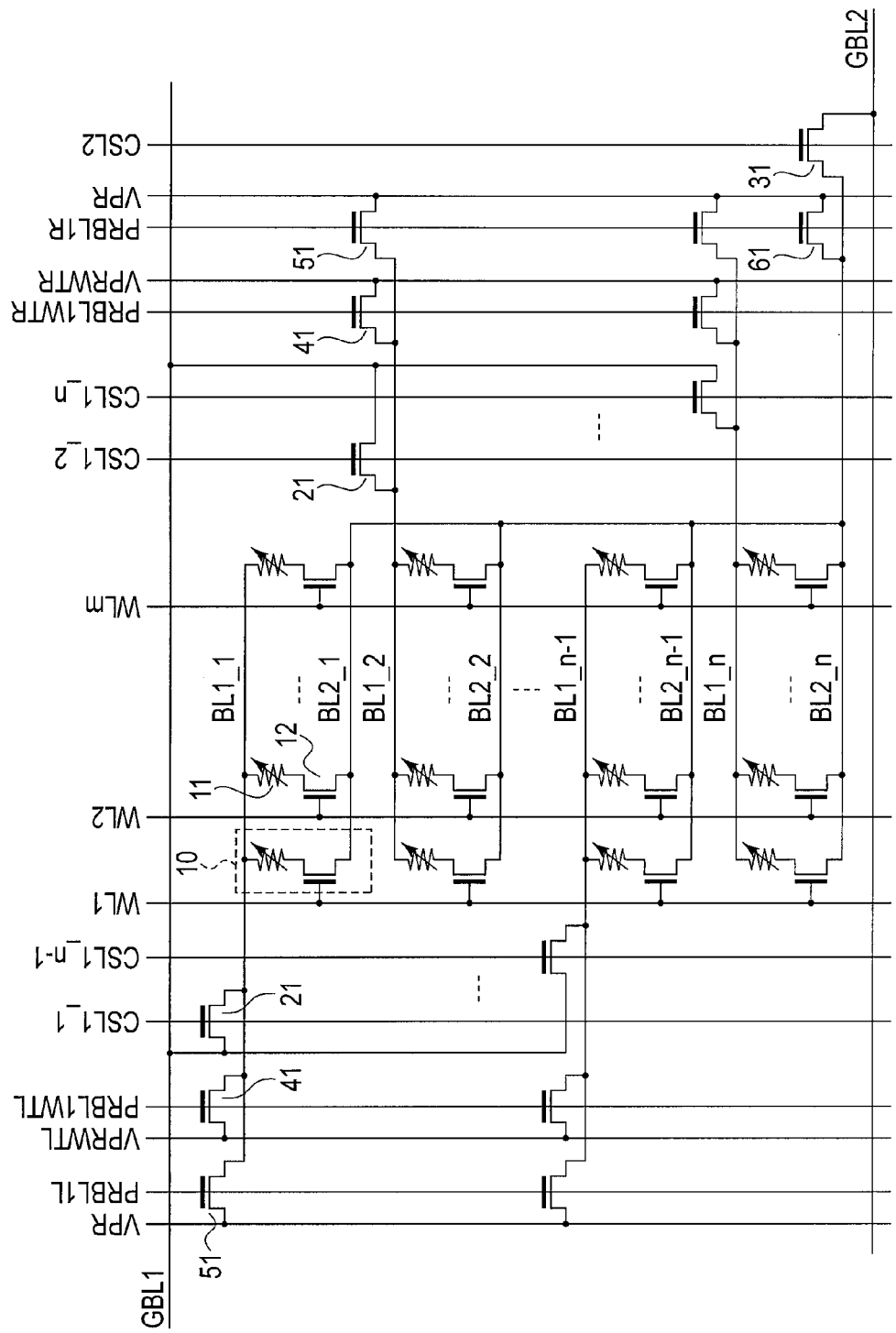
FIG. 22 is an electric circuit diagram showing a configuration of a memory device according to a third modified embodiment in the third embodiment.

FIG. 22 is an electric circuit diagram showing a configuration of a memory device according to a third modified embodiment in the third embodiment. It should be noted that since the basic structure is similar to that of the above-described embodiment, the structural elements corresponding to those shown in FIG. 17 are denoted by the same reference numbers as in FIG. 17, and the description of the matters described in the embodiment is omitted.

In this modified embodiment, the standby precharge transistor 61 for the second bit line BL2 is controlled in common with the standby precharge transistor 51 for the first bit line BL1. That is, the common precharge control signal line (standby precharge control signal line) PRBL1R is connected to the standby precharge transistor 61 and the standby precharge transistor 51.

Also in this modified embodiment, an advantage similar to that of the above-described embodiment can be obtained.

(Fourth Modified Embodiment)

Figure 23:
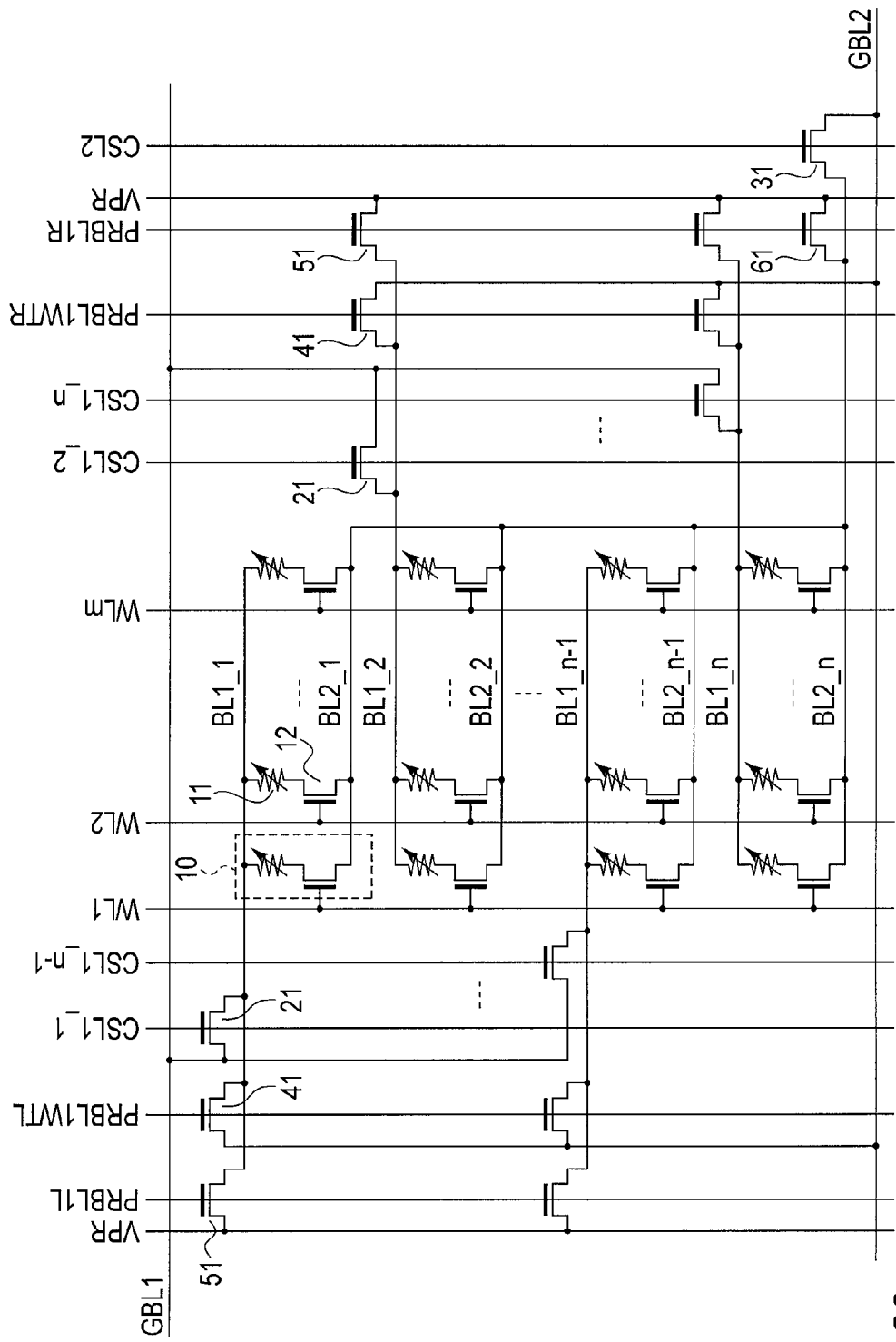
FIG. 23 is an electric circuit diagram showing a configuration of a memory device according to a fourth modified embodiment in the third embodiment.

FIG. 23 is an electric circuit diagram showing a configuration of a memory device according to a fourth modified embodiment in the third embodiment. It should be noted that since the basic structure is similar to that of the above-described embodiment, the structural elements corresponding to those shown in FIG. 17 are denoted by the same reference numbers as in FIG. 17, and the description of the matters described in the embodiment is omitted.

Also in this modified embodiment, the standby precharge transistor 61 for the second bit line BL2 is controlled in common with the standby precharge transistor 51 for the first bit line BL1 in the same manner as in the above-described third modified embodiment. Thus, the description of the matters described in the third modified embodiment is omitted.

Although the precharge line VPRWTL was connected to the input terminal of the precharge transistor 41 in the above-described third modified embodiment, the second global bit line GBL2 is connected to the input terminal of the precharge transistor 41 in this modified embodiment. In brief, this modified embodiment corresponds to the combination of the second and third modified embodiments of the third embodiment.

Also in this modified embodiment, an advantage similar to that of the above-described embodiment can be obtained.

It should be noted that in this embodiment, a common precharge control signal is not necessarily applied to all the precharge transistors. If the above-described embodiment including such a case is generalized, at least two of the precharge transistors 41 are configured to apply a precharge voltage to at least two of the corresponding first bit lines BLs1 before writing information to the selected memory cell 10, and the precharge voltage should be identical to the voltage to be applied to at least two of the second bit lines BLs2 paired with the at least two first bit lines BLs1. Then, a plurality of first bit lines should be alternately led from one side and the other side of the cell array block including the plurality of memory cells 10.

It should be noted that various modified embodiment as described in the first embodiment can be adopted also in this embodiment.

Although a magnetoresistive effect element is used as the storage element 11 in the above-described first to third embodiments, other resistance-change type storage elements can also be used for the storage element 11. That is, for example, it can be applied not only to an MRAM using a magnetoresistive effect element, but to a non-volatile RAM such as a ReRAM using a resistance-change element and a PCRAM using a phase-change element as the storage element 11.

Also, although a form of performing writing by supplying a current to a resistance-change type element is described in each of the above-described embodiments, the above-described structures can also be applied to a form of performing writing by applying a voltage to the resistance-change type element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a plurality of memory cells comprising series connections of storage elements and cell transistors, and arranged in rows and columns, each of the storage elements storing information based on a change of resistance;
a plurality of word lines, each word line connecting control terminals of the cell transistors provided in each row;
a plurality of first bit lines, each first bit line connecting first terminals of the series connections provided in each column;
a plurality of second bit lines, each second bit line connecting second terminals of the series connections provided in each column;
a plurality of column selection transistors connected to the first bit lines; and
a plurality of precharge transistors connected to the first bit lines,
wherein at least two of the precharge transistors are selected by a common control signal and apply a precharge voltage to at least two of the corresponding first bit lines after a standby period and before writing information to a selected memory cell, and the precharge voltage is the same as a voltage to be applied to at least two of the second bit lines paired with the at least two of the first bit lines.

2. The device of claim 1, wherein the control signal is supplied to the at least two of the precharge transistors by a common control line.

3. The device of claim 1, wherein the at least two of the second bit lines are commonly connected.

4. The device of claim 1, wherein the same voltage as the precharge voltage is applied to the at least two of the second bit lines when the information is written to the selected memory cell.

5. The device of claim 1, wherein the information to be stored in the storage element is determined based on polarity or magnitude of a current flowing through the storage element.

6. The device of claim 1, wherein the precharge voltage is fixed.

7. The device of claim 1, wherein the precharge voltage has a voltage level according to the information to be written to the selected memory cell.

8. The device of claim 1, wherein the first bit lines are alternately led from one side and another side of a cell array block including the memory cells.

9. The device of claim 1, wherein the storage element is a magnetoresistive effect element.

10. The device of claim 1, further comprising a standby precharge transistor connected to the first bit lines,
wherein the standby precharge transistor applies a standby precharge voltage to the first bit lines in the standby period.

11. A memory device comprising:
a plurality of memory cells comprising series connections of storage elements and cell transistors, and arranged in rows and columns, each of the storage elements storing information based on a change of resistance;
a plurality of word lines, each word line connecting control terminals of the cell transistors provided in each row;
a plurality of first bit lines, each first bit line connecting first terminals of the series connections provided in each column;
a plurality of second bit lines, each second bit line connecting second terminals of the series connections provided in each column;
a plurality of column selection transistors connected to the first bit lines; and
a plurality of precharge transistors connected to the first bit lines,
wherein at least two of the precharge transistors apply a precharge voltage having a voltage level according to information to be written to a selected memory cell to at least two of the corresponding first bit lines before writing the information to the selected memory cell, and the precharge voltage is the same as a voltage to be applied to at least two of the second bit lines paired with the at least two of the first bit lines.

12. The device of claim 11, wherein the same voltage as the precharge voltage is applied to the at least two of the second bit lines when the information is written to the selected memory cell.

13. The device of claim 11, wherein the information to be stored in the storage element is determined based on polarity or magnitude of a current flowing through the storage element.

14. The device of claim 11, wherein the first bit lines are alternately led from one side and another side of a cell array block including the memory cells.

15. The device of claim 11, wherein the storage element is a magnetoresistive effect element.

16. The device of claim 11, wherein the at least two of the precharge transistors apply the precharge voltage having the voltage level according to the information to be written to the selected memory cell to the at least two of the corresponding first bit lines after a standby period and before writing the information to the selected memory cell.

17. The device of claim 16, further comprising a standby precharge transistor connected to the first bit lines,
wherein the standby precharge transistor applies a standby precharge voltage to the first bit lines in the standby period.

18. A memory device comprising:
a plurality of memory cells comprising series connections of storage elements and cell transistors, and arranged in rows and columns, each of the storage elements storing information based on a change of resistance;
a plurality of word lines, each word line connecting control terminals of the cell transistors provided in each row;
a plurality of first bit lines, each first bit line connecting first terminals of the series connections provided in each column;
a plurality of second bit lines, each second bit line connecting second terminals of the series connections provided in each column;
a plurality of column selection transistors connected to the first bit lines; and
a plurality of precharge transistors connected to the first bit lines,
wherein at least two of the precharge transistors apply a precharge voltage to at least two of the corresponding first bit lines after a standby period and before writing information to a selected memory cell, the precharge voltage is the same as a voltage to be applied to at least two of the second bit lines paired with the at least two of the first bit lines, and the first bit lines are alternately led from one side and another side of a cell array block including the memory cells.

19. The device of claim 18, wherein the same voltage as the precharge voltage is applied to the at least two of the second bit lines when the information is written to the selected memory cell.

20. The device of claim 18, wherein the information to be stored in the storage element is determined based on polarity or magnitude of a current flowing through the storage element.

21. The device of claim 18, wherein the storage element is a magnetoresistive effect element.

22. The device of claim 18, further comprising a standby precharge transistor connected to the first bit lines,
wherein the standby precharge transistor applies a standby precharge voltage to the first bit lines in the standby period.

* * * * *